United States Patent
Kung et al.

(10) Patent No.: US 11,043,396 B2
(45) Date of Patent: Jun. 22, 2021

(54) CHEMICAL MECHANICAL POLISH SLURRY AND METHOD OF MANUFACTURE

(71) Applicant: Taiwan Semiconductor Manufacturing Company, Ltd., Hsinchu (TW)

(72) Inventors: Chun-Hao Kung, Hsinchu (TW); Tung-Kai Chen, New Taipei (TW); Chih-Chieh Chang, Zhubei (TW); Kao-Feng Liao, Hsinchu (TW); Hui-Chi Huang, Zhubei (TW); Kei-Wei Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/179,307

(22) Filed: Nov. 2, 2018

(65) Prior Publication Data
US 2020/0043745 A1 Feb. 6, 2020

Related U.S. Application Data

(60) Provisional application No. 62/712,854, filed on Jul. 31, 2018.

(51) Int. Cl.
*H01L 21/321* (2006.01)
*H01L 21/768* (2006.01)
(Continued)

(52) U.S. Cl.
CPC ........... *H01L 21/3212* (2013.01); *C09G 1/02* (2013.01); *C09G 1/04* (2013.01); *H01L 21/30625* (2013.01); *H01L 21/76843* (2013.01)

(58) Field of Classification Search
CPC ........... H01L 21/3212; H01L 21/30625; H01L 21/76843; C09G 1/02; C09G 1/04
(Continued)

(56) References Cited

U.S. PATENT DOCUMENTS

2010/0184291 A1* 7/2010 Shin .................... C09G 1/02
438/692
2012/0058641 A1* 3/2012 Raman ................ C09G 1/02
438/692

(Continued)

OTHER PUBLICATIONS

"Standard Electrode Potentials" via http://www.benjamin-mills.com/chemistry/ecells.htm ; pp. 1-2; No date available.*
(Continued)

*Primary Examiner* — Binh X Tran
(74) *Attorney, Agent, or Firm* — Slater Matsil, LLP

(57) ABSTRACT

Methods of manufacturing a chemical-mechanical polishing (CMP) slurry and methods of performing CMP process on a substrate comprising metal features are described herein. The CMP slurry may be manufactured using a balanced concentration ratio of chelator additives to inhibitor additives, the ratio being determined based on an electro potential (Ev) value of a metal material of the substrate. The CMP process may be performed on the substrate based on the balanced concentration ratio of chelator additives to inhibitor additives of the CMP slurry.

20 Claims, 12 Drawing Sheets

(51) Int. Cl.
    *C09G 1/02*     (2006.01)
    *C09G 1/04*     (2006.01)
    *H01L 21/306*     (2006.01)

(58) Field of Classification Search
    USPC ................................................ 438/692, 693
    See application file for complete search history.

(56) References Cited

U.S. PATENT DOCUMENTS

2018/0057710 A1*   3/2018   Yasui .................... H01L 21/304
2018/0340094 A1*  11/2018   Liang .................. H01L 21/3212

OTHER PUBLICATIONS

"Standard Electrode Potentials" via http://www.benjamin-mills.com/chemistry/ecells.htm ; pp. 1-2; Printed on Apr. 24, 2020.*

* cited by examiner

CHEMICAL MECHANICAL POLISH SLURRY AND METHOD OF MANUFACTURE

PRIORITY CLAIM AND CROSS-REFERENCE

This application is a Non-Provisional Application which claims priority to and the benefit of U.S. Provisional Application No. 62/712,854, filed on Jul. 31, 2018, entitled "Chemical Mechanical Polish Slurry and Method of Manufacture," which application is hereby incorporated herein by reference in its entirety.

BACKGROUND

Generally, chemical mechanical polishing (CMP) may be performed to remove excess conductive material from a surface of a workpiece. For example, excess conductive material may be deposited in and overfill openings of a dielectric layer during a plating process for forming contact plugs of finFET devices disposed in an underlying substrate of the workpiece. In addition to removing excess conductive material, the CMP process may planarize the surface of the workpiece such that the conductive material disposed within the openings form contact plugs that are isolated within the dielectric layer. For example, the excess conductive material of a surface of the workpiece may be contacted to a polishing pad, and the two may be rotated in order to grind excess conductive material away. This grinding process may be assisted by the use of a CMP slurry, which may contain additives that can assist in the grinding process and help remove the conductive material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
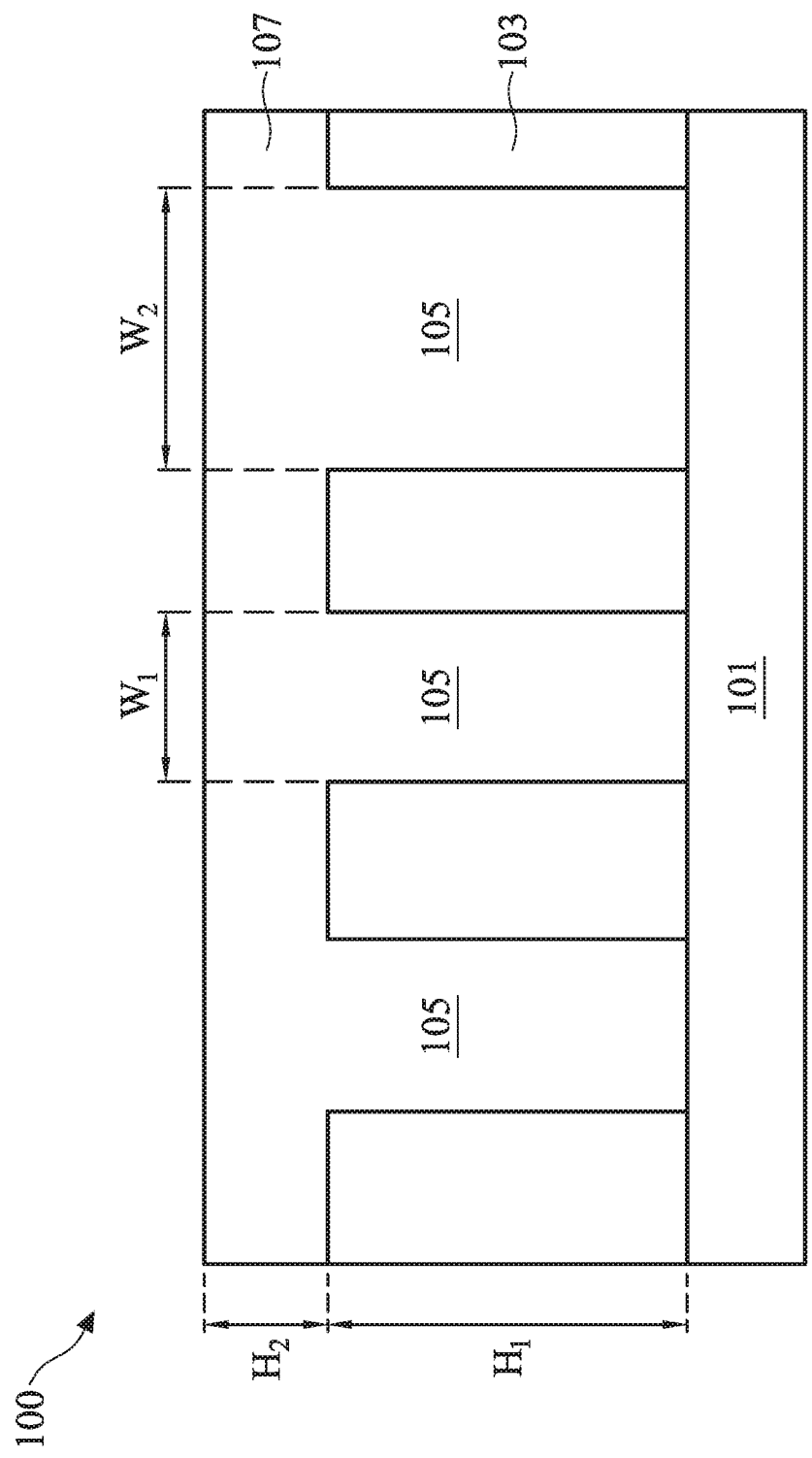
FIG. 1 illustrates a workpiece including a substrate with an overlying dielectric layer and contact openings overfilled with a conductive material, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments will be described with respect to embodiments in a specific context, namely chemical mechanical polishing (CMP) slurries and CMP processes utilized in manufacturing semiconductor devices including integrated contact structures with metal plug contacts down to a semiconductor substrate. The embodiments may also be applied, however, to other metal contact structures and other CMP processes.

With reference now to FIG. 1, there is shown a workpiece 100 including a substrate 101, an inter-layer dielectric (ILD) layer 103, and a conductive fill material 105 forming contact plugs isolated within the ILD layer 103 and forming an overfill layer 107 of the conductive fill material 105 disposed over the ILD layer 103. However, any suitable materials and any suitable number of material layers may be included in the workpiece 100. In some embodiments, the workpiece 100 may be subject to one or more CMP processes using one or more CMP slurries. However, any number of suitable CMP processes, using any suitable slurries, may be performed on the workpiece 100.

The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

In addition, the substrate 101 may include active devices formed within the substrate 101. As one of ordinary skill in the art will recognize, a wide variety of active devices and passive devices such as transistors, capacitors, resistors, combinations of these, and the like may be used to generate the desired structural and functional requirements of the design for a semiconductor device and may be formed using any suitable methods. For example, in some embodiments the active devices may be FinFET devices, wherein fins of semiconductor materials are formed with gate stacks over fins of the FinFET devices with shallow trench isolation (STI) regions formed between fins and with source/drain regions formed within the fins on opposite sides of the gate stacks.

The ILD layer 103 may be formed over the substrate 101 in order to provide electrical isolation between the substrate 101 and metallization layers (e.g., redistribution layers, external contact layers, and/or external contacts, etc.) overlying the substrate 101. The ILD layer 103 may be a dielectric film. The ILD layer 103 may have a planarized surface and may be comprised of dielectric materials such as doped or undoped silicon oxide, silicon nitride, doped silicate glass, other high-k materials, combinations of these, or the like, could be utilized. In an embodiment the ILD layer 103 may comprise a material such as boron phosphorous silicate glass (BPSG), although any suitable dielectrics may be used for either layer. The ILD layer 103 may be formed using a process such as CVD, PVD, PECVD, although other processes, such as LPCVD, may also be used.

After formation, the ILD layer 103 may be planarized using, e.g., a chemical mechanical polish (CMP) process, according to some embodiments, in order to planarize the ILD layer 103. However, any other suitable planarization process may be used to reduce the ILD layer 103 to the desired height and to provide a flat profile for the ILD layer 103. In an embodiment, the ILD layer 103 may be formed to thickness having a first height $H_1$ of between about 10 nm and about 50 nm, such as about 20 nm. However, any suitable thickness may be used.

Once the ILD layer 103 has been formed, contact plug openings may be made through the ILD layer 103 to expose contact areas on a surface of the substrate 101 facing the ILD layer 103. According to some embodiments, these contact areas on the surface of the substrate 101 may be contacts of either the source/drain regions or else the gate electrodes of the active devices (e.g., finFET devices) of the substrate 101. In other embodiments, the contact areas on the surface of the substrate 101 may be contacts of a redistribution layer that are electrically coupled to either the source/drain regions or else the gate electrodes of the active devices of the substrate 101.

In an embodiment the contact plug openings may be formed using a suitable photolithographic masking and etching process. However, any suitable process may be used to form the contact plug openings. Furthermore, in some embodiments, the contact plug openings may be formed such that different sets of the contact plug openings have different widths. For example, a first set of the contact plug openings may have first widths $W_1$ at a surface of the ILD layer 103 opposite the substrate 101 and a second set of the contact plug openings may have second widths $W_2$ at a surface of the ILD layer 103 opposite the substrate 101. In an embodiment, the first width $W_1$ may be between about 10 nm and about 30 nm, such as about 20 nm and the second width $W_2$ may be between about 10 nm and about 300 nm, such as about 240 nm. However, any suitable width may be used. In other embodiments, the contact plug openings may have a same width.

Once the contact plug openings have been formed, a contact plug adhesive layer (e.g., glue) may be deposited in the contact plug openings. In an embodiment the contact plug adhesive layer may be utilized to adhere the contact plugs (once formed) to the underlying structure, such as, the contact areas on the surface of the substrate 101. In some embodiments, the contact plug adhesive layer may contain a conductive material (e.g., ruthenium, tungsten, titanium nitride, tantalum nitride, or the like) and may be formed using a process such as CVD, plasma enhanced chemical vapor deposition (PECVD), physical vapor deposition (PVD), atomic layer deposition (ALD), and the like or the like. However, any suitable conductive materials and deposition process may be used.

The remaining portion of the contact plug openings may be filled with the conductive fill material 105 and in contact with the contact plug adhesive layer to provide an electrical connection through the ILD layer 103 to the substrate 101. The conductive fill material 105 may be referenced herein with respect to one of cobalt (Co), copper (Cu), tungsten (W), titanium (Ti) or other metal films, according to some embodiments, although any suitable material, such as tungsten nitride, aluminum, silver, gold, rhodium, molybdenum, nickel, cadmium, zinc, alloys of these, combinations thereof, and the like, may also be utilized for the conductive fill material 105. The conductive fill material 105 may be formed within contact openings using a process such as plating (e.g., electroplating, electroless-plating), physical vapor deposition (PVD), chemical vapor deposition (CVD), plasma-enhanced chemical vapor deposition (PECVD), atomic layer deposition (ALD), combinations of these, or the like. In an embodiment, the conductive fill material 105 may be deposited to overfill the contact openings such that an overfill layer 107 of the conductive fill material 105 is disposed above the ILD layer 103 to a second height $H_2$. In an embodiment, the second height $H_2$ may be between about 10 nm and about 30 nm, such as about 20 nm. However, any suitable height may be used. However, any suitable height may be used.

Once the conductive fill material 105 has been formed to the desired height, the workpiece 100 is prepared for subsequent CMP removal processes. According to embodiments described herein, a CMP slurry may be prepared based on certain characteristics of the conductive fill material 105 of the workpiece 100 and the subsequent CMP removal processes may be performed such that metal corrosion and metal ion re-deposition on surfaces of the workpiece 100 are minimized.

Figure 2:
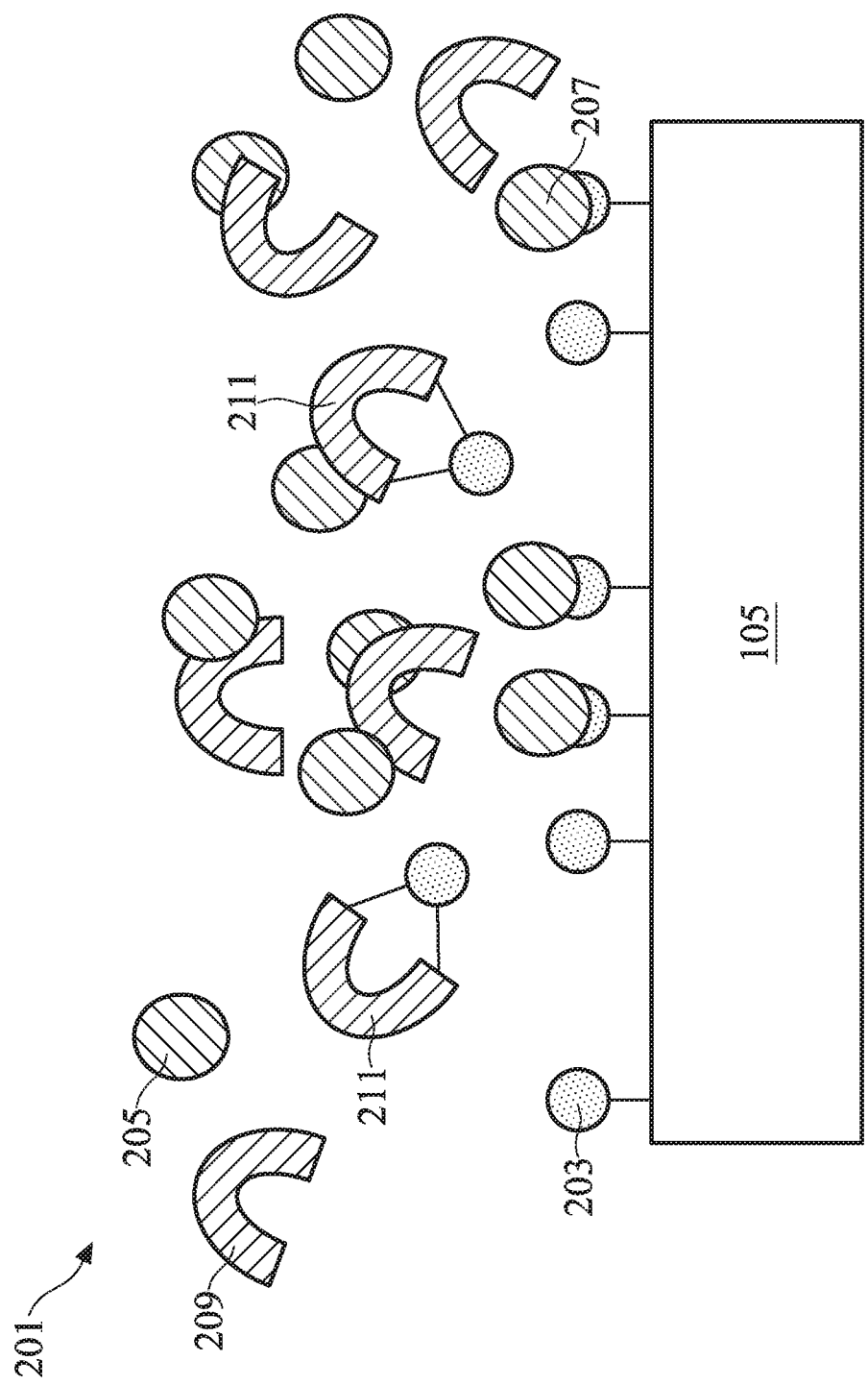
FIG. 2 illustrates a CMP slurry acting on surface atoms of a conductive material of the workpiece of FIG. 1, in accordance with an embodiment.

FIG. 2 illustrates an application of the CMP slurry 201 during a CMP processing of a surface of the workpiece 100 to assist in the removal of portions of the conductive fill material 105. According to embodiments described herein, the CMP slurry 201 may comprise one or more abrasives, surfactants, solvents, and/or additives that assist to perform the subsequent CMP removal processes performed on the surfaces of the workpiece 100.

The abrasives in the CMP slurry 201 may be any suitable particulate or combination of suitable particulates that, in conjunction with the first polishing pad 803, aids in the rapid mechanical removal of the overfill layer 107 of the conductive fill material 105. The abrasives may have a relatively high polish rate for the conductive fill material 105 and a relatively low polish rate for dielectric materials (e.g., oxide film) of the ILD layer 103. In an embodiment, the abrasive may be silica (e.g., silicon oxide). According to an embodiment, the CMP slurry 201 may include a CMP slurry abrasive type including: colloidal silica, alumina, ceria, germania, titania, zirconia and the CMP slurry abrasive may have a primary particle diameter ranging from about 30 nm to about 100 nm, such as about 60 nm. However, any other suitable abrasive, such as aluminum oxide, cerium oxide, titanium dioxide, polycrystalline diamond, polymer particles such as polymethacrylate or polymethacryclic, combinations of these, or the like, may be utilized and are fully intended to be included within the scope of the embodiments. In an embodiment, the concentration of the abrasives in the CMP slurry 201 may be between about 0.1% by weight and about 10% by weight, such as about 4% by weight of the CMP slurry 201.

The surfactant may be utilized to help disperse the abrasive and other additives within the CMP slurry 201 and may also prevent the abrasive from agglomerating during the CMP process. In an embodiment the surfactant may include sodium salts of polyacrylic acid, potassium oleate, sulfosuccinates, sulfosuccinate derivatives, sulfonated amines, sulfonated amides, sulfates of alcohols, alkylanyl sulfonates, carboxylated alcohols, alkylamino propionic acids, alkyliminodipropionic acids, potassium oleate, sulfosuccinates, sulfosuccinate derivatives, sulfates of alcohols, alkylanyl sulfonates, carboxylated alcohols, sulfonated amines, sulfonated amides, alkylamino propionic acids, alkyliminodipropionic acids, combinations of these, or the like. However, these embodiments are not intended to be limited to these surfactants, as any suitable surfactant may be utilized as the first surfactant. In an embodiment, the concentration of the surfactant in the CMP slurry 201 may be between about 0.1% by weight and about 5% by weight, such as about 1% by weight of the CMP slurry 201.

The solvent may be utilized to combine the abrasive, the surfactant, and the additives to allow the mixture to be distributed and dispersed during the CMP process. In an embodiment, the solvent of the CMP slurry 201 may be deionized water or an alcohol. However, any other suitable solvent may also be utilized. In an embodiment, the concentration of the solvent in the CMP slurry 201 may be between about 80% by weight and about 99% by weight, such as about 98% by weight of the CMP slurry 201. For example, water may be used as the solvent and the concentration of water in the CMP slurry 201 may be between about 0.1 wt % and about 3.0 wt % based on a total quantity of the CMP slurry 201.

More specifically, FIG. 2 illustrates a plurality of additives of the CMP slurry 201 acting on a plurality of conductive material atoms 203 (e.g., metal ions) of the conductive fill material 105 at the surface of the workpiece 100. The CMP slurry 201 may comprise one or more additives including: inhibitor additives (e.g., a CMP inhibitor), chelator additives, reactant additives, pH adjuster additives, and the like. For example, adding an abrasive species to the slurry may help to facilitate mechanical removal of exposed surfaces of the conductive fill material 105. In some embodiments, a polishing remove rate may be enhanced by adding a chelator additive and/or a reactant additive to the CMP slurry 201 to accelerate removal of metal ions of the conductive fill material 105 via an oxidation reaction and/or via metal complex formation. In some embodiments, wherein the conductive fill material 105 of the workpiece 100 has several recessed regions, an inhibitor additive may be added to the slurry to inhibit corrosion of the recessed areas in the conductive layer. In some embodiments, a pH adjuster adjusts the pH value of the slurry by adding an alkaline or by adding an acid agent to precisely control a pH value within the range from 2 to 14. In an embodiment, an oxidizer agent may be added into the slurry to promote a chemical reaction between the oxidizing agent and a metal layer of the substrate in order to enhance a polishing remove rate. In an embodiment, wherein a conductive layer of the workpiece 100 has several recessed regions, an inhibitor additive may be added to the slurry to inhibit corrosion of the recessed areas in the conductive layer. Thus, the plurality of additives may help to improve the performance of the CMP slurry 201 during CMP processing (e.g., prevent dishing and/or prevent metal ion re-deposition), in accordance with some embodiments.

The CMP slurry 201 may further comprise a corrosion inhibitor additive comprising a carboxyl type corrosion inhibitor based on the properties of the conductive fill material 105 and that is suitable for preventing the corrosion of the conductive fill material 105, according to some embodiments. For example, as illustrated in FIG. 2, the CMP slurry 201 may comprise a carboxyl type corrosion inhibitor additive including a plurality of carboxyl type inhibitor molecules 205 (e.g., inhibiting agents), according to some embodiments. The plurality of carboxyl type inhibitor molecules 205 may bond with single atoms of the plurality of conductive material atoms 203 to form a plurality of carboxyl type metal complexes 207. The carboxyl type metal complexes 207 may help to resist the removal of some of the plurality of conductive material atoms 203 in order to prevent undesirable corrosion of the conductive fill material 105 (e.g., dishing) during CMP processing. In an embodiment, the plurality of carboxyl type inhibitor molecules 205 may include short carbon chain inhibitors (i.e., $C \leq 20$), including function groups, such as phosphates, sulfates, nitrates, and the like. However, any suitable carboxyl type corrosion inhibitor additive may be used.

As further illustrated in FIG. 2, the CMP slurry 201 may comprise a chelating additive suitable for the removal of the conductive fill material 105. The chelating additive may enhance the polishing removal rate of the CMP slurry 201. For example, the CMP slurry 201 may comprise an amino group chelating additive including a plurality of chelator molecules 209 (e.g., chelating agents), according to some embodiments. In some embodiments, the amino groups used for the chelating additive may include primary, secondary and ternary amine groups (e.g., glycine, alanine, histidine, lysine, derivatives thereof, and the like); see tables 1 and 2 below for these and other examples. However, any suitable amino group chelating additive may be used.

TABLE 1

| R—N̈—H, H (A 1° amine) | R—N̈—R, H (A 2° amine) | R—N̈—R, R (A 3° amine) |
| --- | --- | --- |

TABLE 2

| Methionine Met, M | Cysteine Cys, C | Serine Ser, S |
| --- | --- | --- |

TABLE 2-continued

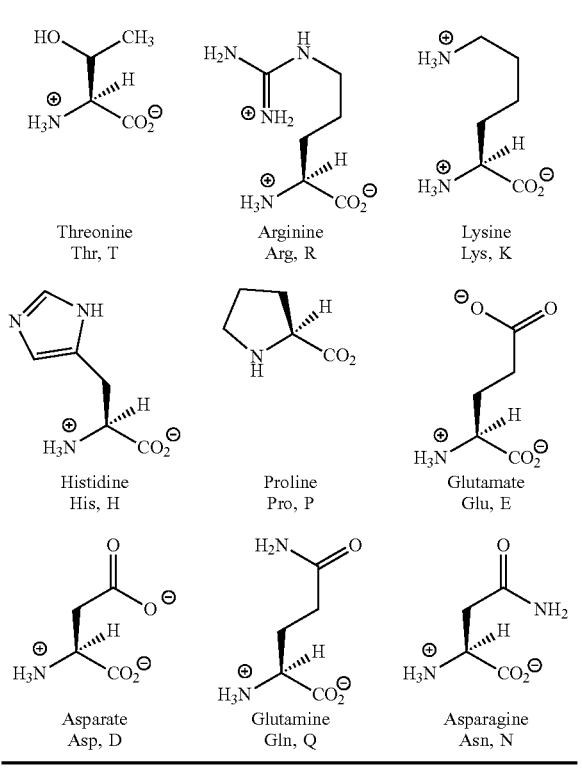

FIG. 2 further illustrates, single chelator molecules of the plurality of chelator molecules 209 may bond with, bind, or otherwise attach to a plurality of the conductive material atoms 203 to form a plurality of chelated atoms 211. Once formed, the plurality of chelated atoms 211 may be removed during the CMP processing to effectively remove the plurality of conductive material atoms 203 from the surface of the conductive fill material 105. The plurality of chelator molecules 209 may remove at least some of the conductive material atoms 203 from the surface of the conductive fill material 105. As such, according to one embodiment, the plurality of chelator molecules 209 may remove a one-atom thick layer of the conductive material atoms 203 from the conductive fill material 105 in order to provide a highly controlled removal of the conductive fill material 105 and prevent re-disposition of metal ions during CMP processing.

Figure 3:
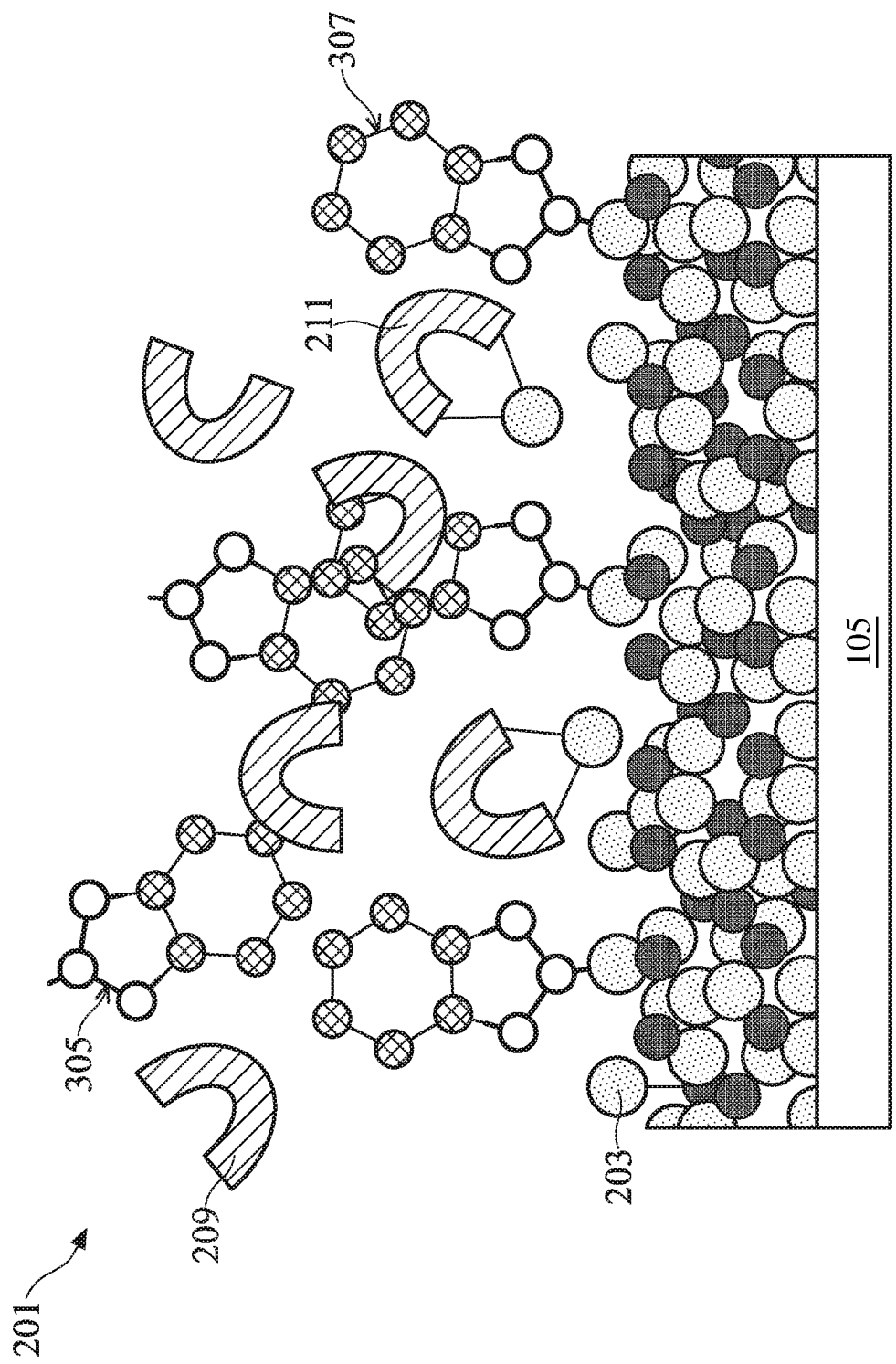
FIG. 3 illustrates a CMP slurry acting on surface atoms of a conductive material of the workpiece of FIG. 1, in accordance with an embodiment.

Turning to FIG. 3, according to other embodiments, the CMP slurry 201 may comprise a corrosion inhibitor additive comprising a benzene type corrosion inhibitor based on the properties of the conductive fill material 105 and suitable for preventing the corrosion of the conductive fill material 105. For example, as illustrated in FIG. 3, the benzene type corrosion inhibitor includes a plurality of benzene type inhibitor molecules 305. The plurality of benzene type inhibitor molecules 305 may bond with atoms of the plurality of conductive material atoms 203 to form a plurality of benzene type metal complexes 307. The benzene type metal complexes 307 may help to resist or inhibit the removal of some of the plurality of conductive material atoms 203 in order to provide a highly controlled removal of the conductive fill material 105 during CMP processing. In an embodiment, the benzene type corrosion inhibitors may include triazoles such as 1, 2, 4-triazole, benzotriazole (BTA), alkane (carbon amount about 1 to 20) with a phosphate group as a protect substrate film function, and the like. However, any suitable benzene type corrosion inhibitor may be used.

Figure 4:
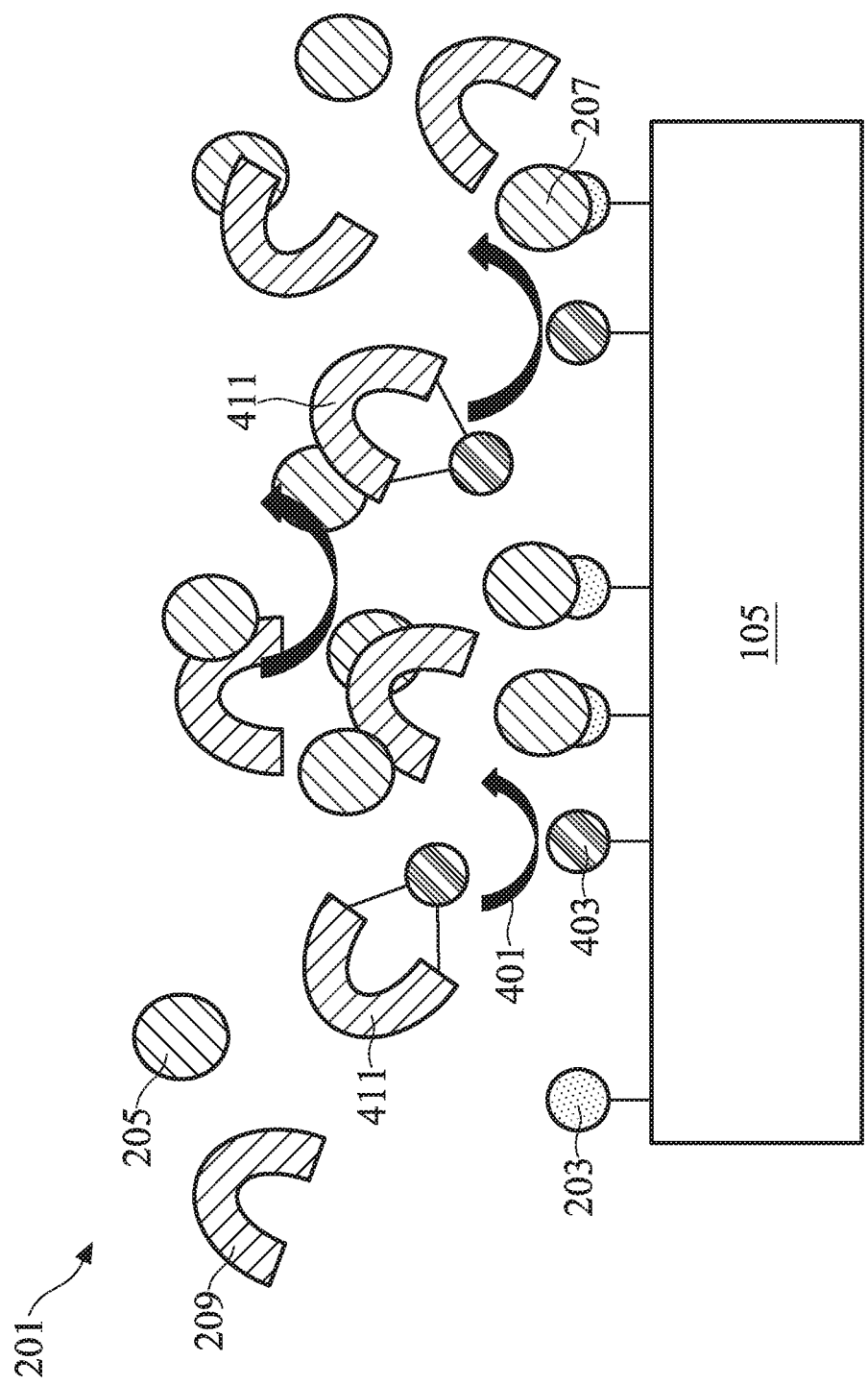
FIG. 4 illustrates a CMP slurry acting on surface atoms of a conductive material of the workpiece of FIG. 1, in accordance with an embodiment.

FIG. 4 illustrates, according to some embodiments, a reactant additive (e.g., oxidation agent) including a plurality of oxidation agent molecules 401 may be added to the CMP slurry 201 in order to assist in removal of the conductive fill material 105. The plurality of oxidation agent molecules 401 may react with the single atoms of the plurality of conductive material atoms 203 to form a plurality of oxidized atoms 403. As such, the plurality of chelator molecules 209 may easily bond with, easily bind, or otherwise easily attach to one of the oxidized atoms 403 to form a plurality of chelated oxidized atoms 411 (e.g., oxidized chelate). Once formed, the plurality of chelated oxidized atoms 411 may be removed during the CMP processing to enhance the polishing removal rate of the CMP slurry 201 and to effectively accelerate the removal of the plurality of conductive material atoms 203 from the surface of the conductive fill material 105.

Oxidized metal is softer than pure metal of the same material; therefore, less mechanical force is required to remove the plurality of oxidized atoms 403 of the conductive fill material 105 during the CMP processing of the workpiece 100 as compared to the mechanical force necessary to remove pure metal atoms from the conductive fill material 105. As such, the single atoms of the plurality of oxidized atoms 403 may be more readily available to form a plurality of chelated oxidized atoms 411 with single chelator molecules of the plurality of chelator molecules 209 as compared to the availability of the single conductive material atoms of the plurality of conductive material atoms 203 during a same CMP processing of the conductive fill material 105. Since the single atoms of the oxidized atoms 403 may be more readily available to allow for easy metal complex formation with single chelator molecules of the plurality of chelator molecules 209, the amount of chelator required during the CMP processing may be less and/or the mechanical force used during the CMP processing may be decreased.

For example, in an embodiment in which the conductive fill material 105 comprises cobalt, the reactant additive may include hydrogen peroxide ($H_2O_2$) as the plurality of oxidation agent molecules 401. As such, the plurality of hydrogen peroxide molecules may react with single atoms of the cobalt material of the conductive fill material 105 to form oxidized atoms 403 of the cobalt material and the plurality of chelator molecules 209 may easily bond with, easily bind, or otherwise easily attach to one of the oxidized atoms 403 of the cobalt material to form the plurality of chelated oxidized atoms 411. Once formed, the plurality of chelated oxidized atoms 411 of the cobalt material may be removed during the CMP processing to effectively remove the plurality of conductive material atoms 203 of the cobalt material from the surface of the conductive fill material 105.

Although hydrogen peroxide ($H_2O_2$) is referred to in the example above, it is to be understood that any other reactant additive suitable for reacting with and for aiding in the removal of one or more materials of the conductive fill material 105 may be utilized. Some other suitable reactants may include: nitric acid compound ($Fe(NO_3)_3$, $KNO_3$, derivatives thereof, and the like. Still other suitable reactants may include but are not limited to: hydroxylamine, periodic acid, ammonium persulfate, other periodates, iodates, peroxomonosulfates, peroxymonosulfuric acid, perborates, malonamide, combinations of these, and the like. However, these embodiments are not intended to be limited to these reactant additives, as any suitable reactant additive may be utilized. In an embodiment, the concentration of the reactive additive including the plurality of oxidation agent molecules 401 in the CMP slurry 201 may be between about 0.05% by weight and about 20% by weight, such as about 0.40% by weight of the CMP slurry 201. However, any suitable concentration of the reactant additive may be used.

The reactant additive may be added to the CMP slurry 201 to soften the conductive fill material 105. As such, the oxidized atoms 403 of the softened conductive fill material 105 are more easily removed than the conductive material atoms 203 of the hardened material of the conductive fill material 105. Therefore, the reactive additive (e.g., oxidizer agent) may allow for a chemical force to be relied on to a greater extent and less mechanical force is needed to remove the oxidized atoms 403 of the softened conductive fill material 105 during the CMP processing of the workpiece 100 as compared to the mechanical force that is needed to remove the conductive material atoms 203 of the hardened material of the conductive fill material 105 during the CMP processing of the workpiece 100 without using the reactive additive. Furthermore, a lesser amount of chelator additive is needed to remove the oxidized atoms 403 of the softened conductive fill material 105 as compared to an amount of chelator additive needed to remove the conductive material atoms 203 of the hardened material of the conductive fill material 105. In some embodiments, the concentration of chelator additives used in the CMP slurry 201 during CMP processing to remove the oxidized atoms 403 of the softened material of the conductive fill material 105 may be between about 0.1% by weight and about 10% by weight, such as about 3% by weight less than the concentration of chelator additives used in the CMP slurry 201 during CMP processing to remove the conductive material atoms 203 of the hardened material of the conductive fill material 105 without using the reactant additive.

Still other additives may be mixed into the CMP slurry 201. For example, pH adjusting additives (e.g., alkaline agents and/or acid agents) may be added to the CMP slurry 201 to precisely control the pH levels of the CMP slurry 201. In some embodiments, the pH adjusting additives are used to precisely control the pH level of the CMP slurry 201 to be maintained between about 2-14. However, any suitable pH levels may be used. Examples of some suitable pH adjusting additives may include but are not limited to: $HNO_3$, $H_3PO_4$, KOH, TEAH, and ammonium hydroxide derivatives, and the like. However, any suitable pH adjusting additive may be used. In an embodiment, the concentration of the pH adjusting additives in the CMP slurry 201 may be between about 0% by weight and about 10% by weight, such as about 4% by weight of the CMP slurry 201.

Figure 5:
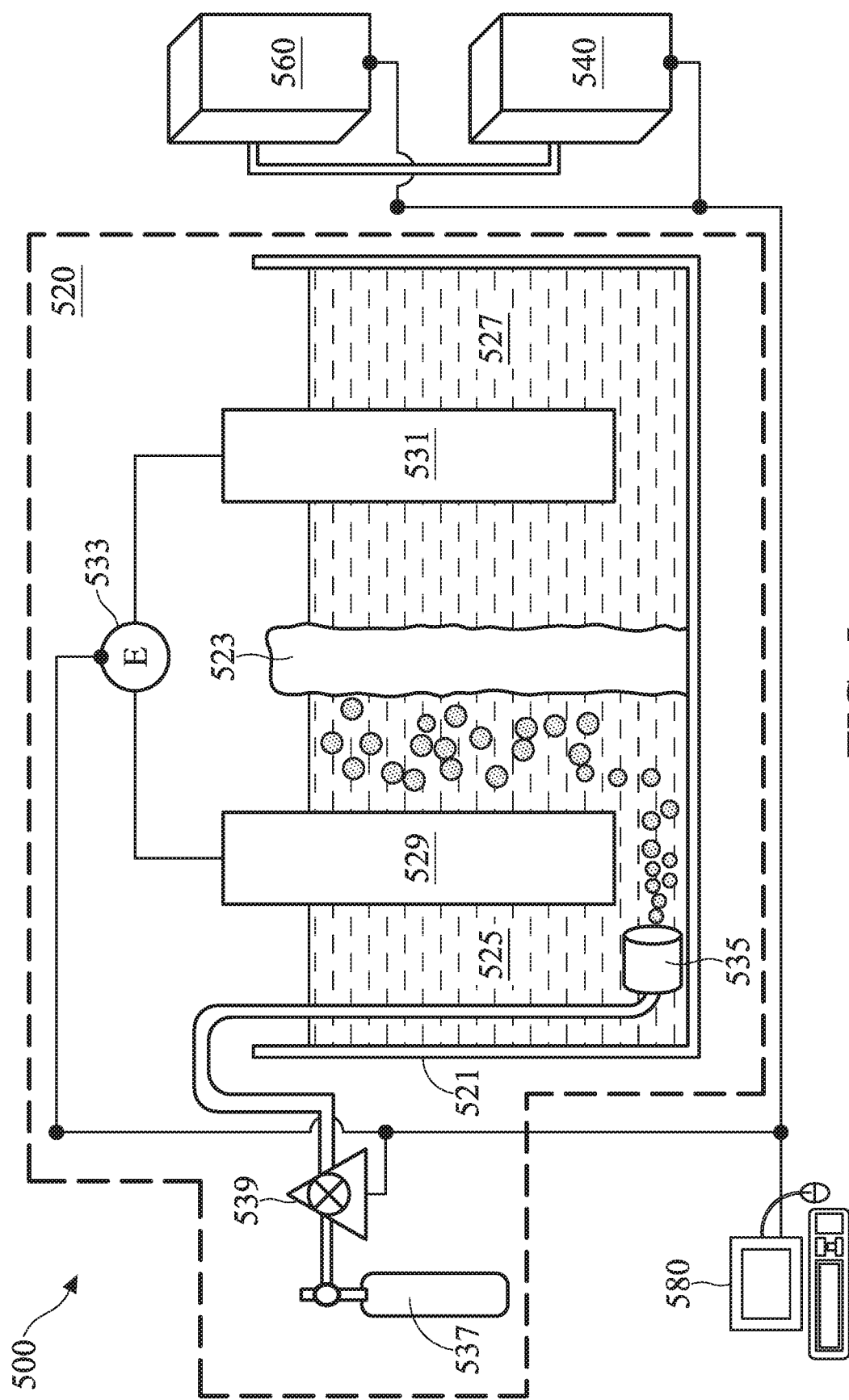
FIG. 5 illustrates a test system for determining characteristics of materials used in forming the workpiece of FIG. 1, in accordance with some embodiments.

FIG. 5 illustrates a semiconductor processing system 500 comprising a test system 520, a slurry preparation system 540, a CMP processing system 560 and a control unit 580. The semiconductor processing system 500 may be configured to test a material (e.g., the conductive fill material 105 used in forming the workpiece 100) in order to determine one or more characteristics of the test material. The semiconductor processing system 500 may also be configured to prepare the CMP slurry 201 based on the one or more determined characteristics of the test material. Once the CMP slurry 201 is prepared, the semiconductor processing system 500 may be configured to use the CMP slurry 201 during CMP processing of the workpiece 100.

In an embodiment, the test system 520 may be configured to test, for example, the conductive fill material 105 of the workpiece 100 in order to determine one or more characteristics (e.g., an electrical potential (Ev)) of the conductive fill material 105. As illustrated in FIG. 5, the test system 520 may include a container 521 with a porous separator 523 separating a first solution 525 (e.g., sulfuric acid ($H_2SO_4$)) from a second solution 527 (e.g., $Mz^{+1}$, where $Mz^{+1}$ represents $Ag^+$). The test system 520 may also include a reference electrode 529 containing a first material (e.g., Platinum (Pt)) and a test electrode 531 containing a second material used for the conductive fill material 105 (e.g., copper (Cu)). The test system 520 may also include a voltmeter 533 (e.g., a heat resistant voltmeter) connected between the reference electrode 529 and the test electrode 531. The voltmeter 533 may be configured to measure a voltage across the reference electrode 529 and the test electrode 531 as a result of the electrochemical reactions between the material of the reference electrode 529 and the first solution 525 and between the material of the test electrode 531 and the second solution 527.

According to some embodiments, the test system 520 may also include a reactant gas inlet 535 for releasing a reactive gas into the first solution 525 with the reference electrode 529. In an embodiment, the first material contained in the reference electrode 529 may be e.g., platinum (Pt) and the reactive gas may be hydrogen ($H_2$) which will dissociate into $H^+$. However, any suitable reactive gases may be selected and used with any suitable material contained in the reference electrode 529. The reactive gas may be provided from a reactive gas cylinder 537 connected via a reactive gas controller 539 to the reactant gas inlet 535. The reactive gas controller 539 may be configured to maintain both a pressure and a temperature of the reactive gas. In an embodiment, the reactive gas may be hydrogen ($H_2$) and the pressure of the reactive gas may be maintained at or above 1 atm and the temperature of the reactive gas may be maintained at 298° K or about 25° C. However, based on the reactive gas selected, any suitable pressure and any suitable temperature may be maintained by the reactive gas controller 539. The reactive gas controller 539 may be controlled via the control unit 580 and the control unit 580 may be configured to read the voltage detected by the voltmeter 533. In other embodiments, based on the first material contained in the reference electrode 529, the reactive gas controller 539 may be controlled to not release a reactive gas into the first solution 525.

According to some embodiments, the test system 520 may be configured to determine an electrical potential (Ev) of the material of the conductive fill material 105 used in forming the workpiece 100 based on the voltage detected by the voltmeter 533. For example, in an embodiment, the conductive fill material 105 of the workpiece 100 may comprise a cobalt (Co) containing material. As such, the cobalt (Co) containing material may be selected for use in the test electrode 531 and, for example, a platinum (Pt) containing material may be selected for use in the reference electrode 529. As such, the reference electrode 529 may be placed in the first solution 525 (e.g., sulfuric acid ($H_2SO_4$)) held within the container 521 on a first side of the porous separator 523 and the test electrode 531 may be placed in the second solution 527 (e.g., $Mz^{+1}$, where $Mz^{+1}$ represents $Ag^+$ as a solution for reacting with cobalt (Co)) held within the container 521 on a second side of the porous separator 523.

In addition, the control unit 580 may direct the reactive gas controller 539 to release the reactive gas from the reactant gas inlet 535 into the first solution 525 (e.g., sulfuric acid ($H_2SO_4$)) to react with the platinum (Pt) containing material of the reference electrode 529. As the platinum (Pt) containing material of the reference electrode 529 reacts with the first solution 525 and the reactive gas, and as the cobalt (Co) containing material of the test electrode 531 reacts with the second solution 527 (e.g., $Mz^{+1}$, where $Mz^{+1}$ represents $Ag^+$), the voltmeter 533 measures a voltage generated across the electrodes as a result of the electrochemical reactions occurring between these materials. The control unit 580 may be configured to read the voltage measured by the voltmeter 533 and to determine an electrical potential (Ev) of the cobalt (Co) containing material based on the measured voltage. For example, as the cobalt (Co) of the test electrode 531 reacts with the second solution 527, a reduction of the cobalt material occurs (e.g., $Co^{2+}(aq)+2e^- \rightleftharpoons Co(s)$) resulting in an electrical potential (Ev) of the cobalt (Co) containing material of the conductive fill material 105 to be a voltage of about −0.28V.

In another embodiment, the conductive fill material 105 of the workpiece 100 may comprise a copper (Cu) containing material. As such, the copper (Cu) containing material may be selected for use in the test electrode 531 and the test electrode 531 may be placed in the second solution 527 (e.g., $Mz^{+1}$, where $Mz^{+1}$ represents $Ag^+$ as a solution for reacting with copper (Cu)) held within the container 521 on the second side of the porous separator 523. As described in the example above, the control unit 580 may read the voltage measured by the voltmeter 533 and may determine an electrical potential (Ev) of the copper (Cu) containing material based on the measured voltage. For example, as the copper (Cu) of the test electrode 531 reacts with the second solution a reduction of the copper material occurs (e.g., $Cu^{2+}(aq)+2e^- \rightleftharpoons Cu(s)$) resulting in an electrical potential (Ev) of the copper (Cu) containing material of the conductive fill material 105 to be a voltage of about +0.34V.

In still other embodiments, the conductive fill material 105 of the workpiece 100 may comprise a tungsten (W) containing material. As such, the tungsten (W) containing material may be used in the test electrode 531 and a suitable solution (e.g., $Mz^{+1}$, where $Mz^{+1}$ represents $Ag^+$ as a solution for reacting with tungsten (W)) may be used as the second solution 527 in the test system 520. The control unit 580 may determine, as described in the example above, an electrical potential (Ev) of the tungsten (W) containing material to be a voltage of about −0.12V. Furthermore, in some embodiments, the conductive fill material 105 of the workpiece 100 may comprise a titanium (Ti) containing material. As such, the titanium (Ti) containing material may be used in the test electrode 531 and a suitable solution (e.g., $Mz^{+1}$, where $Mz^{+1}$ represents $Ag^+$ as a solution for reacting with titanium (Ti)) may be used as the second solution 527 in the test system 520. The control unit 580 may determine, as described in the example above, an electrical potential (Ev) of the titanium (Ti) containing material to be a voltage of about −1.6V.

A metal film determined to have a lower electrical potential (Ev) (e.g., $Ev \leq -0.025V$), indicates that the metal film may corrode more easily. In an embodiment, wherein the Ev for the metal film is determined to be less than or equal to −0.25V, a chelator to inhibitor ratio range from 0% to 60% may be utilized to prevent metal corrosion issues (e.g., dishing during CMP processing).

A metal film determined to have a higher Ev (e.g., $Ev > -0.025V$), indicates that metal ion re-deposition may occur more easily to the metal film. In an embodiment, wherein the Ev for the metal film is determined to be greater than −0.25V, a chelator to inhibitor ratio range from 60% to 100% may be utilized to prevent metal ion re-deposition issues (e.g., metal particles remaining on the surface of the substrate after CMP).

Although the examples above are directed towards cobalt, copper, tungsten, and titanium, it is to be understood that any suitable conductive material may be used as the conductive fill material 105 of the workpiece 100 and any suitable solution for reacting with the test electrode 531 containing a suitable conductive material may also be used in the test system 520. However, any suitable conductive material may be used in the test system 520.

Once the control unit 580 has determined the electrical potential (Ev) of the test material, the control unit 580 may determine a chelator to inhibitor (CoI) ratio based on the determined Ev of the test material (e.g., the conductive fill material 105). The CoI ratio indicates an amount of a chelator additive (e.g., in ppm) compared to an amount of an inhibitor additive (e.g., in ppm), for example, the carboxyl type corrosion inhibitor additive including the plurality of carboxyl type inhibitor molecules 205 or, for example, the benzene type corrosion inhibitor includes a plurality of benzene type inhibitor molecules 305 to be added to the CMP slurry.

According to some embodiments, the chelator additive and the inhibitor additive may be mixed into the CMP slurry 201 in the determined CoI ratio. The determined CoI ratio may provide for a concentration of chelator additive to inhibitor additive to achieve a balance between a rate of corrosion and removal of the conductive fill material 105 and a rate of metal ion re-distribution of the conductive fill material 105 during CMP removal which leads to higher yields and limits yield loss.

In some embodiments, the CMP slurry 201 may be prepared without using a reactant additive (e.g., metal oxidizing agent). In these cases, a first CoI ratio may be determined according to the formula:

$$40\% \leq \text{first CoI} \leq 100\%, \text{ when } Ev \leq -0.25V; \text{ and}$$

$$100\% < \text{first CoI} \leq 140\%, \text{ when } Ev > -0.25V.$$

In other embodiments, the CMP slurry 201 may be prepared with using a reactant additive (e.g., metal oxidizing agent). In these other cases, a second CoI ratio may be determined according to the formula:

$$0\% \leq \text{second CoI} \leq 60\%, \text{ when } Ev \leq -0.25V; \text{ and}$$

$$60\% < \text{second CoI} \leq 100\%, \text{ when } Ev > -0.25V.$$

In an embodiment, when the conductive fill material 105 contains, for example, a cobalt (Co) material and the Ev of the conductive fill material is determined to be about −0.28V and a reactive additive will be used in the CMP slurry 201, the CoI ratio is selected to be between about 0% and about 60%, such as between about 40% and 60%. In an embodiment, when the conductive fill material 105 contains a copper (Cu) material and the Ev of the conductive fill material is determined to be about +0.34V and a reactive additive will be used in the CMP slurry 201, the CoI is determined to be between about 60% and about 100%, such as between about 70% and 80%. Other metal films may have a CoI between about $50 < \text{CoI} \leq 60$.

Once the CoI has been determined, the CMP slurry 201 may be prepared using the CoI ratio to mix an appropriate amount of a chelator additive (e.g., in ppm) and mix an appropriate amount of an inhibitor additive (e.g., in ppm) into the CMP slurry 201. In an embodiment, the combined concentration of the chelator additive and inhibitor additive mixed in the CMP slurry 201 may be between about 0.1% by weight and about 10% by weight, such as about 5% by weight of the CMP slurry 201.

Figure 6:
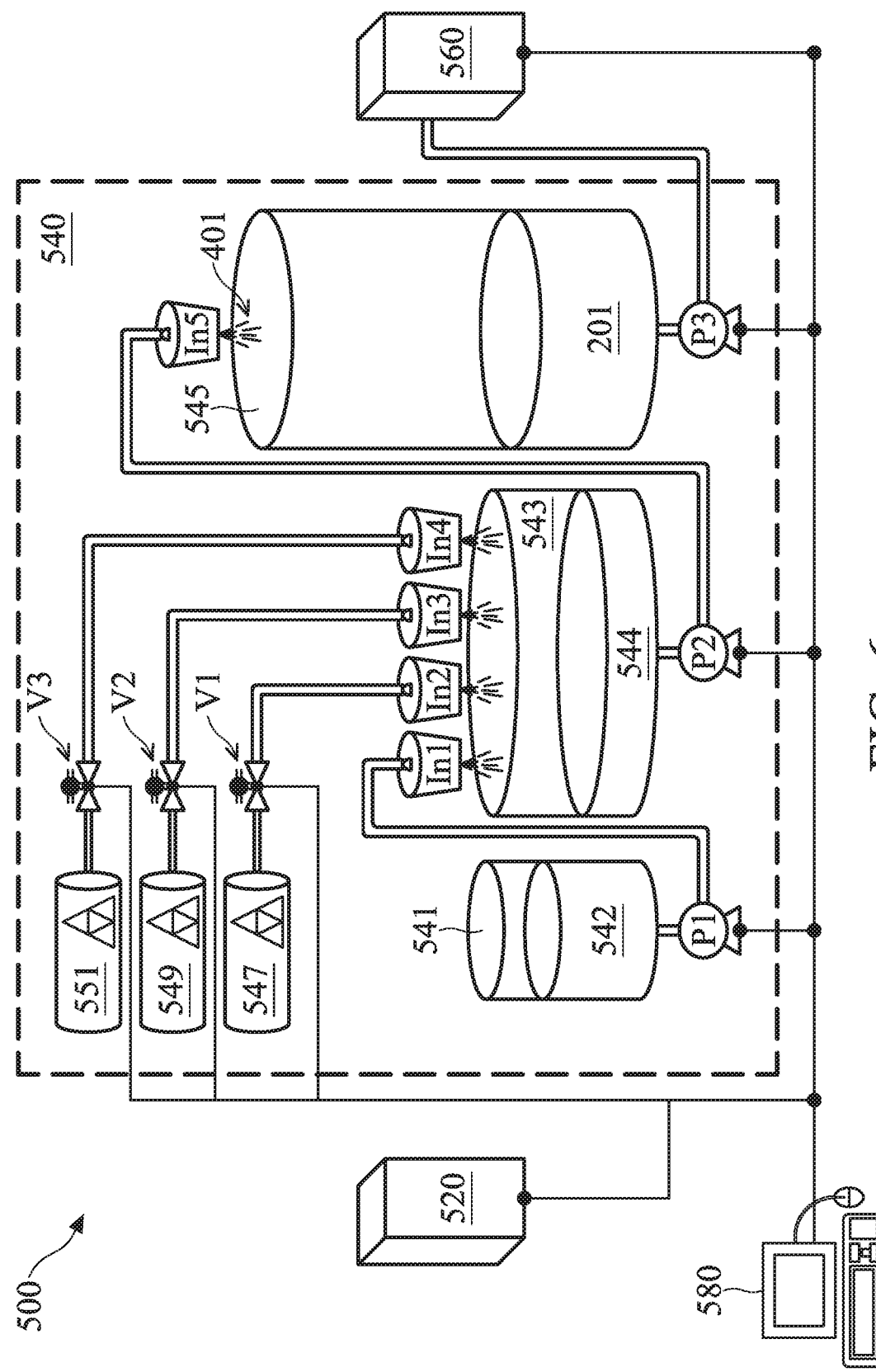
FIG. 6 illustrates a CMP slurry preparation system, in accordance with some embodiments.

FIG. 6 illustrates the slurry preparation system 540 according to some embodiments. The slurry preparation system 540 may be configured to prepare the CMP slurry 201, for example, based on the one or more characteristics (e.g., an electrical potential (Ev)) of the conductive fill material 105, as determined by the control unit 580 and distribute the CMP slurry 201 to the CMP processing system 560 during CMP processing of the workpiece 100. According to an embodiment, the slurry preparation system 540 may include a source-tank 541, a mixing tank 543, and a supply tank 545.

The source-tank 541 may contain a base slurry 542. Under control from the control unit 580 and in response to determining the CoI ratio to be used in the CMP slurry 201, a first amount of the base slurry 542 may be supplied via a first pump P1 and dispensed via a first inlet In1 into the mixing tank 543.

In some embodiments, the control unit 580 may be further configured to determine the chelating additive including the plurality of chelator molecules 209 suitable for use in the CMP slurry 201 based on the properties and characteristics (e.g., Ev) of the conductive fill material 105. Furthermore, the control unit 580 may be configured to calculate a second amount of the chelation additive to be mixed with the base slurry 542 according to the CoI ratio and the first amount of the base slurry. Once the second amount is calculated, the control unit 580 may be configured to control a first valve V1 to supply the second amount of the chelation additive from a first additive storage tank 547 and to dispense the chelation additive via a second inlet In2 into the mixing tank 543.

Furthermore, the control unit 580 may be further configured to determine an inhibitor additive suitable for use in the CMP slurry 201 based on the properties and characteristics (e.g., Ev) of the conductive fill material 105. The control unit 580 may be further configured to calculate a third amount of the inhibitor additive (e.g., the carboxyl type corrosion inhibitor additive including a plurality of carboxyl type inhibitor molecules 205) to be mixed with the base slurry 542 according to the CoI ratio. Once the third amount is calculated, the control unit 580 may be configured to control a second valve V2 to supply the third amount of the chelation additive from a second additive storage tank 549 and to dispense the inhibitor additive via a third inlet In3 into the mixing tank 543.

In some embodiments, the control unit 580 may be further configured to determine a reactant additive (e.g., oxidation agent) suitable for use in the CMP slurry 201 based on the properties and characteristics (e.g., Ev) of the conductive fill material 105 and/or based on a desired rate of removal of the materials of the conductive fill material 105. As such, the control unit 580 may also be configured to calculate a fourth amount of the reactant additive to be mixed with the base slurry 542 according to the CoI ratio and the first amount of the base slurry 542. Once the fourth amount is calculated, the control unit 580 may be configured to control a third valve V3 to supply the fourth amount of the reactant additive from a third additive storage tank 551 and to dispense the reactant additive via a fourth inlet In4 into the mixture 544 contained in the mixing tank 543. In other embodiments, a reactant additive may not be added to the mixture 544 contained in the mixing tank 543.

Still other additives may be added into mixture 544 in order to form the CMP slurry 201 without departing from embodiments disclosed herein. For example, in some embodiments, pH level adjusting additives are used to maintain the pH of the CMP slurry 201 between about 2-14. However, any suitable pH levels may be used. In addition, one or more abrasives, surfactants, solvents, and/or additives may be provided in the base slurry 542 contained in the source-tank 541 and/or may be dispensed into the mixture 544 contained in the mixing tank 543 without departing from the embodiments disclosed herein. The control unit 580 may be further configured to control the mixing performed in the mixing tank 543 including controlling the temperatures, pressures and times of mixing of the one or more abrasives, surfactants, solvents, and/or additives in forming the CMP slurry 201 from the mixture 544.

Once mixed, the CMP slurry 201 may be transferred via a second pump P2 from the mixing tank 543 and dispensed via a fifth inlet In5 into the supply tank 545. Once the workpiece 100 is ready for CMP processing using the CMP slurry 201, the CMP slurry 201 may be provided from the supply tank 545 to the CMP processing system 560 via a third pump P3 under control of the control unit 580.

Figure 7:
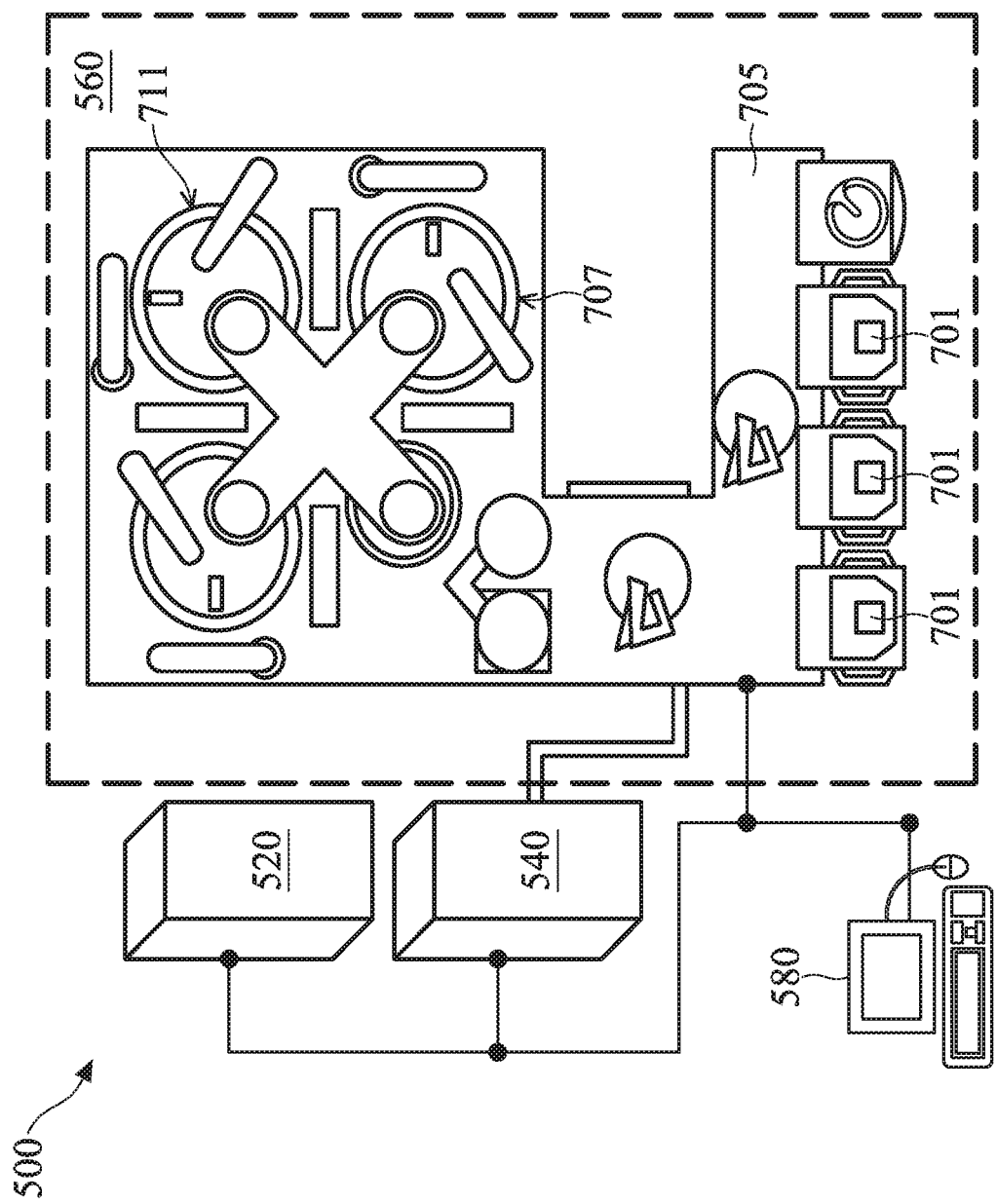
FIG. 7 illustrates a CMP processing system, in accordance with some embodiments.

FIG. 7 illustrates embodiments of the CMP processing system 560 configured to perform the CMP processing using the CMP slurry 201 to assist in the corrosion free and ion re-deposition free CMP removal of portions of the conductive fill material 105 from a surface of the workpiece 100. As illustrated in FIG. 7, the CMP processing system 560 may include loadlocks 701, a cleaning station 705, a high-rate platen 707, and a buffing platen 711. The loadlocks 701 may be used for loading the workpiece 100 into the CMP processing system 560, and then unloading the workpiece 100 once the CMP processing has been completed. The high-rate platen 707 may be used for polishing and removing the conductive fill material 105 with a relatively high polishing rate, such as a bulk polishing rate, while the buffing platen 711 may be used for polishing and removing materials of the ILD layer 103 and also to fix defects and scratches that may occur during the removal of the conductive fill material 105.

Figure 8:
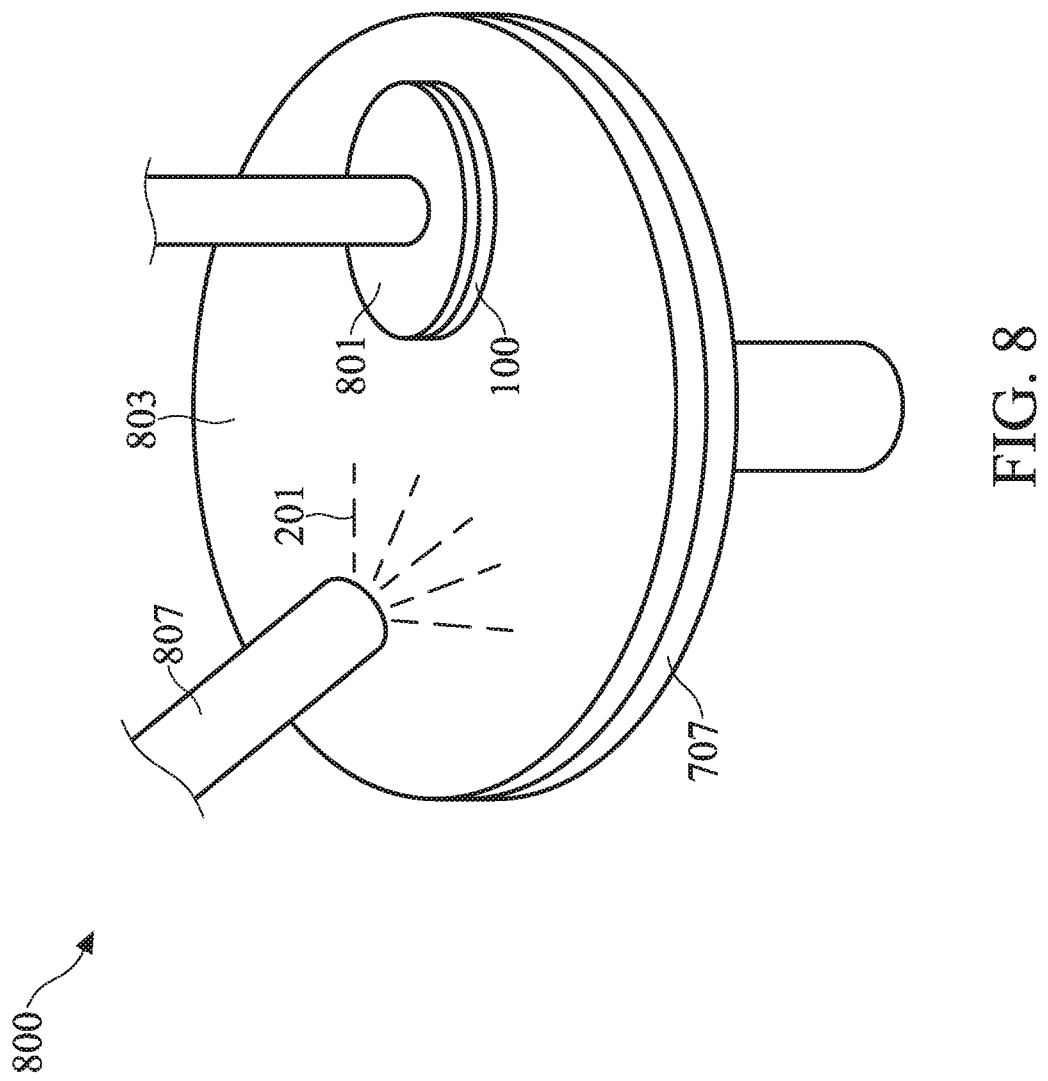
FIG. 8 illustrates a CMP slurry being applied during a bulk CMP processing of surfaces of the workpiece of FIG. 1, in accordance with some embodiments.

FIG. 8 illustrates a bulk CMP processing 800 performed on the workpiece 100 using the CMP slurry 201 and the high-rate platen 707. In an embodiment, the workpiece 100 may be loaded into the CMP processing system 560 through the loadlocks 701 and passed to the high-rate platen 707 for the bulk CMP removal of the overfill layer 107 of the conductive fill material 105. Once at the high-rate platen 707, the workpiece 100 may be connected to a first carrier 801, which faces the surface of the conductive fill material 105 coincident the outer surface of the workpiece 100 towards a first polishing pad 803 connected to the high-rate platen 707.

The first polishing pad 803 may be a hard polishing pad that may be utilized for the relatively quick bulk CMP removal of the overfill layer 107 of the conductive fill material 105. In an embodiment the first polishing pad 803 may be a single layer or composite layer of materials such as polyurethane or polyurethane mixed with fillers, and may have a hardness of about 50 or greater on the Shore D Hardness scale. The surface of the first polishing pad 803 may be a roughened surface with micro-pores within it. However, any other suitable polishing pad may be used to perform the bulk removal of the overfill layer 107 of the conductive fill material 105 (as illustrated in FIG. 1).

During the bulk CMP removal process the first carrier 801 may press the surface of the conductive fill material 105 of the workpiece 100 against the first polishing pad 803. The workpiece 100 and the first polishing pad 803 are each rotated against each other, either in the same direction or else counter-rotated in opposite directions. By rotating the first polishing pad 803 and the workpiece 100 against each other, the first polishing pad 803 mechanically grinds away the conductive fill material 105, thereby effectuating the bulk CMP removal of the overfill layer 107 of the conductive fill material 105. Additionally, in some embodiments the first carrier 801 may move the workpiece 100 back and forth along a radius of the first polishing pad 803.

Additionally, the mechanical grinding of the first polishing pad 803 may be assisted through the use of the CMP slurry 201, which may be dispensed onto the first polishing pad 803 through a slurry dispensing system 807. In an embodiment, the CMP slurry 201 may comprise one or more abrasives, surfactants, solvents, the chelator additives 209, inhibitor additives 205, and/or reactant additives 401 that are suited for the relatively rapid removal of the overfill layer 107 of the conductive fill material 105 from the outer surface of the workpiece 100. In an embodiment, the overall height of the conductive fill material 105 may be reduced by the second height $H_2$ of the overfill layer 107 to the first height $H_1$ of the ILD layer 103. As such, contact plugs of the conductive fill material 105 may be isolated within the ILD layer 103 and a new outer surface of the workpiece 100 may be formed from co-planar surfaces of the contact plugs of the conductive fill material 105 and surfaces of the ILD layer 103 at the first height $H_1$. In an embodiment, the first height $H_1$ may be between about 10 nm and about 50 nm, such as about 20 nm and the second height $H_2$ may be between about 10 nm and about 30 nm, such as about 20 nm.

In addition to the abrasives, surfactants, and solvents, as discussed above, the CMP slurry 201 may further comprise one or more of the inhibitor additives, chelator additives, and/or reactant additives, each additive being suitable for the highly controlled removal of the conductive fill material 105. As discussed above, the CMP slurry 201 may be prepared according to the embodiments described herein with the first amount of inhibitor additives, the second amount of chelator additives according to the CoI ratio determined by the control unit 580 based on the potential voltage (Ev) of the conductive fill material 105 of the workpiece 100 and/or a third amount of reactant additives. As such, during a bulk CMP process using the CMP slurry 201, metal corrosion (e.g., dishing) and metal ion re-deposition on surfaces of the workpiece 100 are minimized.

Once mixed, the CMP slurry 201 may be dispensed onto the first polishing pad 803 by the CMP slurry dispenser 807. In an embodiment, the CMP slurry 201 may be dispensed onto the first polishing pad 803 at a rate of between about 150 sccm and about 350 sccm. In addition, the workpiece 100 may be forced into contact with the first polishing pad 803 by the first carrier 801 pressing the surface of the workpiece 100 against the first polishing pad 803. In an embodiment of the bulk CMP process 800, the first carrier 801 may push the workpiece 100 onto the high-rate platen 707 with a force of between about 1 psi to about 2.5 psi, such as about 1.5 psi. As the high-rate platen 707 rotates the first polishing pad 803 underneath the workpiece 100, the CMP slurry 201 is applied to the exposed surface of the conductive fill material 105 of the workpiece 100 in order to assist in the removal of the conductive fill material 105. In an embodiment, the high-rate platen 807 rotates at a speed of between about 70 rpm to about 150 rpm and the first carrier 801 rotates the workpiece 100 at a speed of about 70 rpm to about 150 rpm.

By rotating the first polishing pad 803 and the workpiece 100 against each other using the CMP slurry 201, the first polishing pad 803 along with the assistance of the one or more abrasives in the CMP slurry 201 mechanically grind away the conductive fill material 105, thereby effectuating a removal of the conductive fill material 105 at a first rate of removal. In an embodiment, the first rate of removal of the conductive fill material 105 is between about 10 nm per minute and about 40 nm per minute, such as about 20 nm per minute. During the bulk CMP process 800 to remove the overfill layer 107, the additives of the CMP slurry 201 act on the plurality of conductive material atoms 203 (e.g., metal ions) of the conductive fill material 105 at the surface of the workpiece 100.

Figure 9:
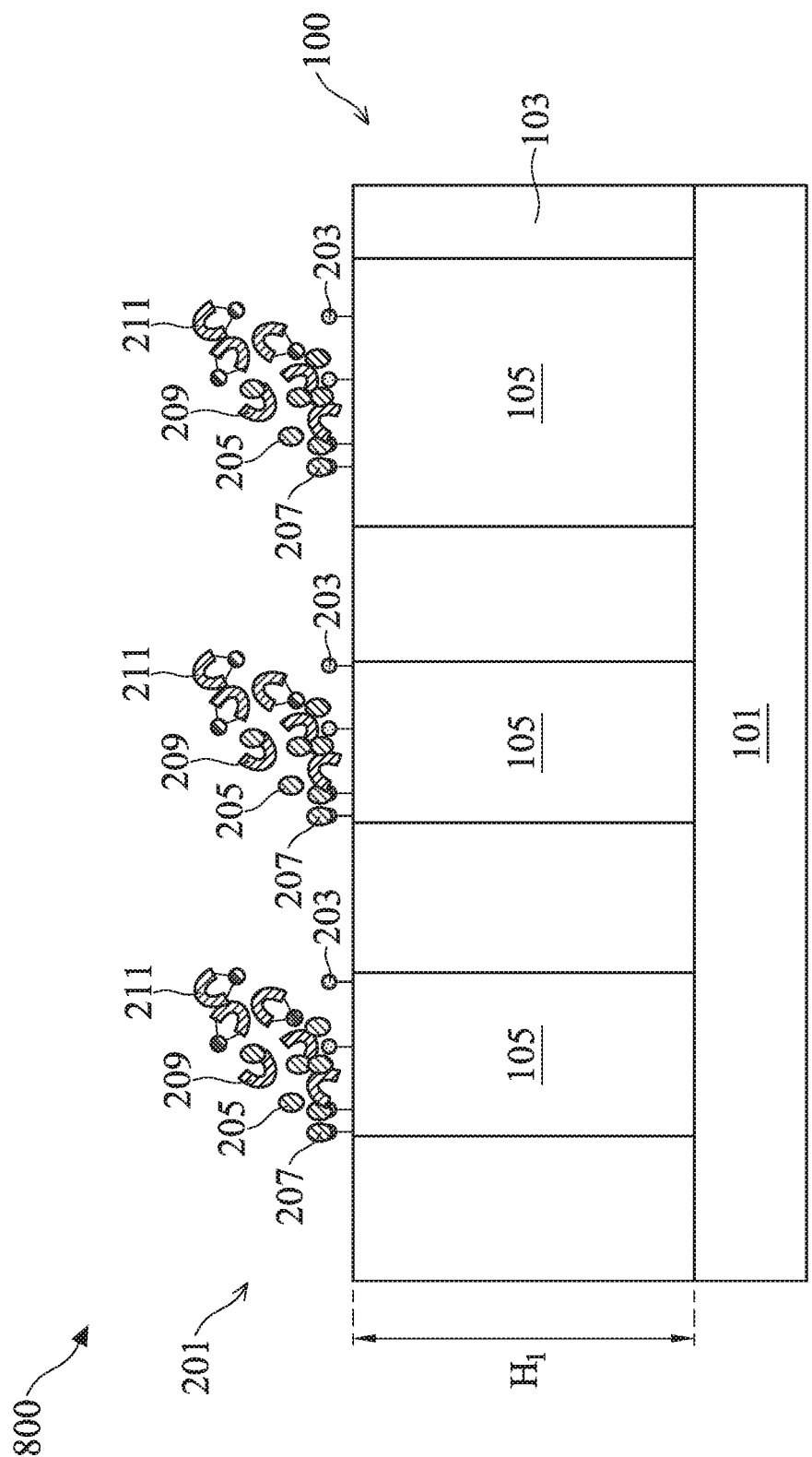
FIG. 9 illustrates a CMP slurry acting on surfaces of the workpiece of FIG. 1 during a bulk CMP process, in accordance with some embodiments.

FIG. 9 illustrates a CMP process using the CMP slurry 201 for a bulk CMP removal of the overfill layer 107 of the conductive fill material 105 as illustrated in FIG. 1. In FIG. 9, as discussed above, the CMP slurry 201 may be prepared, according to embodiments described herein, using the first amount of inhibitor additives and the second amount of chelator additives according to the CoI ratio determined by the control unit 580 based on the potential voltage (Ev) of the conductive fill material 105 of the workpiece 100. In some embodiments, the CMP slurry 201 may be prepared without using a reactant additive, as illustrated in FIG. 9, and in other embodiments, the CMP slurry 201 may be prepared using a reactant additive. The CMP slurry 201 may be prepared according to embodiments described herein such that, during a bulk CMP process using the CMP slurry 201 to remove the overfill layer 107, metal corrosion (e.g., dishing) and metal ion re-deposition on surfaces of the workpiece 100 are minimized.

In more detail, FIG. 9 also illustrates the additives in the CMP slurry 201 acting on the single atoms of the plurality of conductive material atoms 203 (e.g., metal ions) of the conductive fill material 105 during the bulk CMP process 800. According to some embodiments, the plurality of carboxyl type inhibitor molecules 205 may act on single atoms of the plurality of conductive material atoms 203 (e.g., metal ions) of the conductive fill material 105 to form the plurality of carboxyl type metal complex 207. Also illustrated in FIG. 9, the plurality of chelator molecules 209 bond with, bind, or otherwise attach to single atoms of the plurality of the conductive material atoms 203 to form the plurality of chelated atoms 211. As such, the bulk CMP processing 800 to remove the overfill layer 107 of the conductive fill material 105 results in the co-planar surfaces of the conductive fill material 105 of the workpiece 100 with minimized metal corrosion (e.g., dishing) and minimized metal ion re-deposition.

However, as one of ordinary skill in the art will recognize, the above description of removing the overfill layer 107 of the conductive fill material 105 in a single processing step is merely an illustrative example and is not intended to be limiting upon the embodiments. Any number of removal processes and any number of platens may be utilized to remove overfill layer 107 of the conductive fill material 105, and all such combinations are fully intended to be included within the scope of the embodiments.

Figure 10:
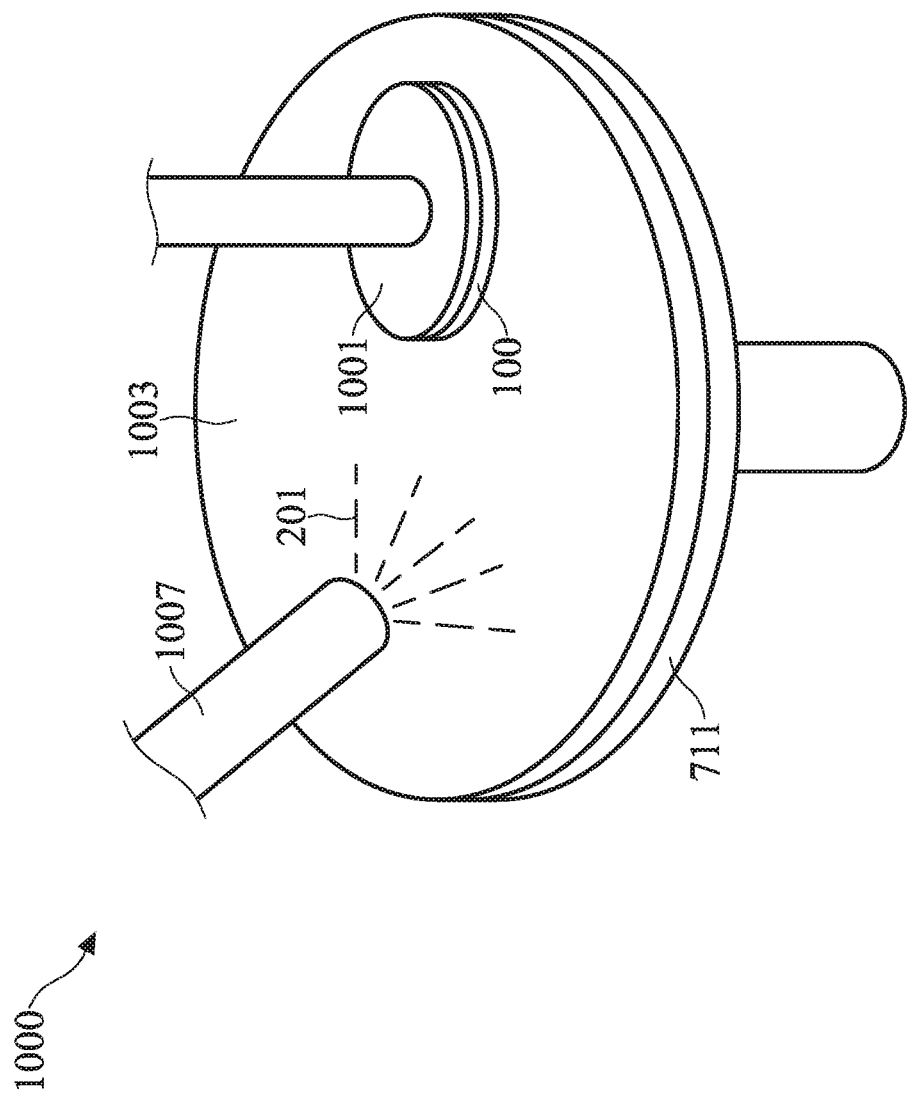
FIG. 10 illustrates a CMP slurry being applied during a buffing CMP processing of surfaces of the workpiece of FIG. 1, in accordance with some embodiments.

FIG. 10 illustrates a buffing CMP processing 1000 performed on the workpiece 100 using the CMP slurry 201 and the buffing platen 711. In an embodiment, the workpiece 100 may be removed from the high-rate platen 707 and may be transferred to the buffing platen 711 (see FIG. 7), where the workpiece 100 may be attached to a second carrier 1001, which also faces the outer surfaces of the conductive fill material 105 and outer surfaces of the ILD layer 103 coincident the outer surface of the workpiece 100 towards a second polishing pad 1003 on the buffing platen 711. The second polishing pad 1003 may perform a similar CMP process as the high-rate platen 707, with the second polishing pad 1003 grinding away the conductive fill material 105 from the outer surface of the workpiece 100 to perform a highly controlled removal of the conductive material atoms 203 at the surface of the conductive fill material 105.

In some embodiments, the CMP slurry 201 used in the buffing CMP processing 1000 may include one or more of the same abrasives, surfactants, solvents, chelator additives, inhibitor additives, and/or reactant additives as used in the bulk CMP processing 800. However, any suitable abrasive, surfactant, solvent, chelator additive, inhibitor additive and/or reactant additive may be utilized in the CMP slurry 201 used in the buffing CMP processing 1000 without departing from the spirit and scope of the embodiments described herein.

Once mixed, the CMP slurry 201 may be dispensed onto the second polishing pad 1003 by the CMP slurry dispenser 1007. In an embodiment, the CMP slurry 201 may be dispensed onto the second polishing pad 1003 at a rate of between about 150 sccm and about 350 sccm. In addition, the workpiece 100 may be forced into contact with the second polishing pad 1003 by the second carrier 1001 pressing the surface of the workpiece 100 against the second polishing pad 1003. In an embodiment of the buffing CMP process 1000, the second carrier 1001 may push the workpiece 100 onto the buffing platen 711 with a force of between about 1 psi to about 2.5 psi, such as about 1.5 psi. As the buffing platen 711 rotates the second polishing pad 1003 underneath the workpiece 100, the CMP slurry 201 may be applied to the exposed surface of the workpiece 100 in order to assist in the removal of the conductive fill material 105 and/or the materials of the ILD layer 103. In an embodiment, the buffing platen 711 rotates at a speed of between about 70 rpm to about 150 rpm while the second carrier 1003 rotates the workpiece 100 at a speed of about 70 rpm to about 150 rpm.

By rotating the second polishing pad 1003 and the workpiece 100 against each other using the CMP slurry 201, the second polishing pad 1003 along with the assistance of the one or more abrasives in the CMP slurry 201 mechanically grind away the conductive fill material 105 and/or the materials of the ILD layer 103, thereby effectuating a removal of the conductive fill material 105 and/or the materials of the ILD layer 103 at a second rate of removal. In an embodiment, the second rate of removal of the conductive fill material 105 and/or the materials of the ILD layer 103 is between about 10 nm per minute and about 40 nm per minute, such as about 20 nm per minute. During the buffing CMP process 1000 to perform the highly controlled removal of the plurality of conductive material atoms 203 at the surface of the conductive fill material 105, the additives of the CMP slurry 201 act on the plurality of conductive material atoms 203 (e.g., metal ions) of the conductive fill material 105 at the surface of the workpiece 100.

Figure 11:
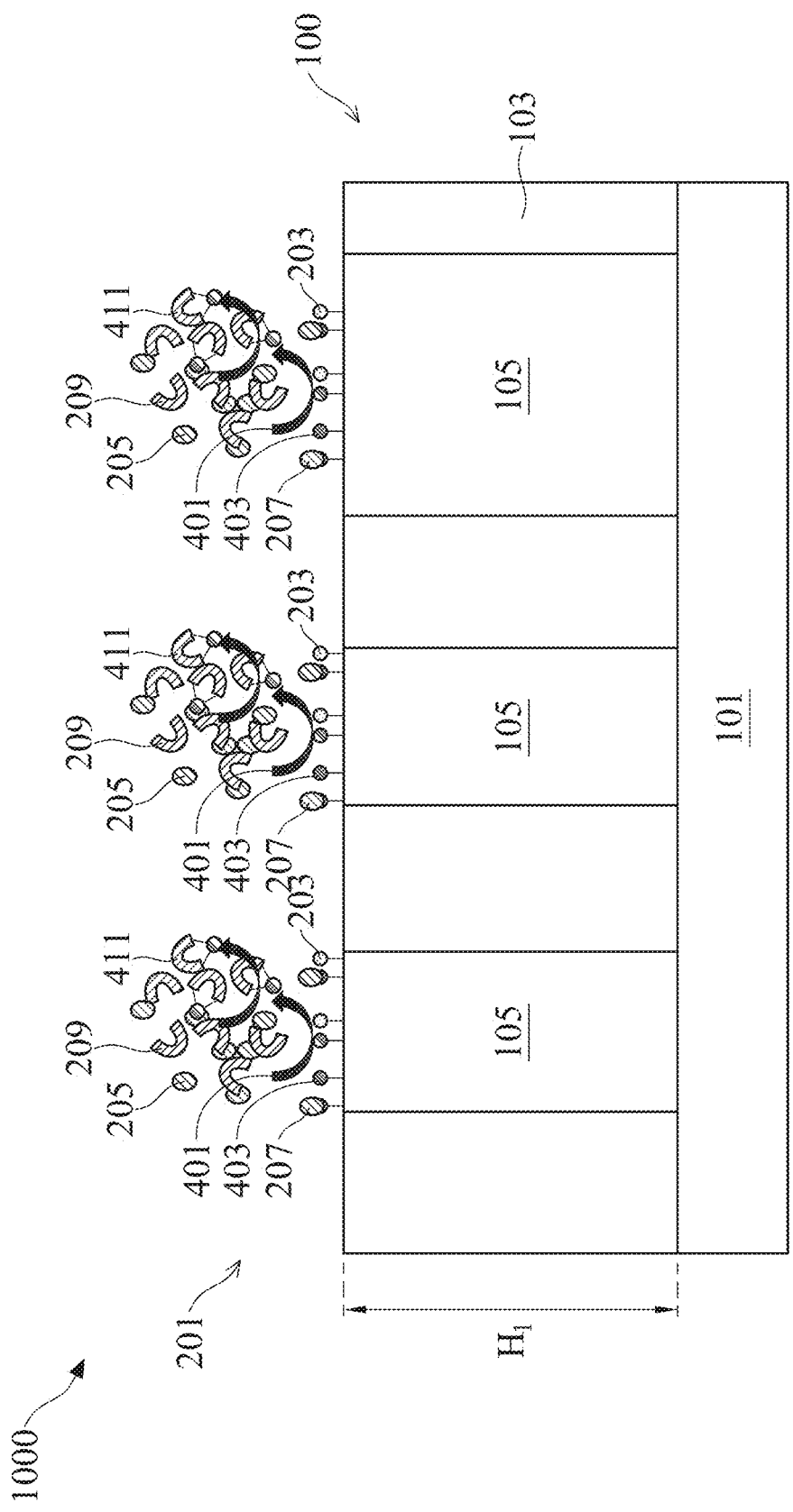
FIG. 11 illustrates a CMP slurry acting on surfaces of the workpiece of FIG. 1 during a buffing CMP process, in accordance with some embodiments.

FIG. 11 illustrates the buffing CMP processing 1000 using the CMP slurry 201 for a buffing CMP removal of the plurality of conductive material atoms 203 at the surface of the conductive fill material 105. In FIG. 11, as discussed above, the CMP slurry 201 may be prepared, according to embodiments described herein, using the first amount of inhibitor additives and the second amount of chelator additives according to the CoI ratio determined by the control unit 580 based on the potential voltage (Ev) of the conductive fill material 105 of the workpiece 100. In some embodiments, the CMP slurry 201 may be prepared using the reactant additive including the plurality of oxidizing agent molecules 401, as illustrated in FIG. 11, and in other embodiments, the CMP slurry 201 may be prepared without using the reactant additive. The CMP slurry 201 may be prepared according to embodiments described herein such that, during a buffing CMP process using the CMP slurry 201 the plurality of conductive material atoms 203 at the surface of the conductive fill material 105 are removed and such that metal corrosion (e.g., dishing) and metal ion re-deposition on surfaces of the workpiece 100 are minimized.

In more detail, FIG. 11 also illustrates the additives in the CMP slurry 201 acting on the atoms of the plurality of conductive material atoms 203 (e.g., metal ions) of the conductive fill material 105 during the buffing CMP process 1000. According to some embodiments, the plurality of carboxyl type inhibitor molecules 205 may act on atoms of the plurality of conductive material atoms 203 (e.g., metal ions) of the conductive fill material 105 to form the plurality of carboxyl type metal complexes 207. Also illustrated in FIG. 11, the plurality of chelator molecules 209 bond with, bind, or otherwise attach to oxidized atoms of the plurality of the oxidized conductive material atoms 403 to form the plurality of chelated oxidized atoms 411. The chelated oxidized atoms 411 are then removed during the buffing CMP processing 1000 to effectively remove the plurality of conductive material atoms 203 (e.g., metal ions). As such, the buffing CMP processing 1000 results in the co-planar surfaces of the conductive fill material 105 of the workpiece 100 with minimized metal corrosion (e.g., dishing) and minimized metal ion re-deposition.

As discussed above, the CMP slurry 201 may be prepared with a first amount of inhibitor additives including a plurality of carboxyl type inhibitor molecules 205 and a second amount of chelator additives including a plurality of chelator molecules 209 according to the CoI ratio determined by the control unit 580 based on a potential voltage (Ev) of the conductive fill material 105 of the workpiece 100. The CMP slurry 201 may be prepared such that, during the buffing CMP process, chelator molecules of the plurality of chelator molecules 209 may bond with, bind, or otherwise attach to a plurality of the conductive material atoms 203 to form a plurality of chelated atoms 211 (e.g., chelate). Once formed, the plurality of chelated atoms 211 may be removed during the buffing CMP process such that metal corrosion (e.g., dishing) and metal ion re-deposition on surfaces of the workpiece 100 are minimized.

However, as one of ordinary skill in the art will recognize, the above description of the removal of the plurality of oxidized atoms 403 from the surface of the conductive fill material 105 in a single processing step is merely an illustrative example and is not intended to be limiting upon the embodiments. Any number of removal processes and any number of platens may be utilized to remove overfill layer 107 of the conductive fill material 105, and all such combinations are fully intended to be included within the scope of the embodiments.

Figure 12:
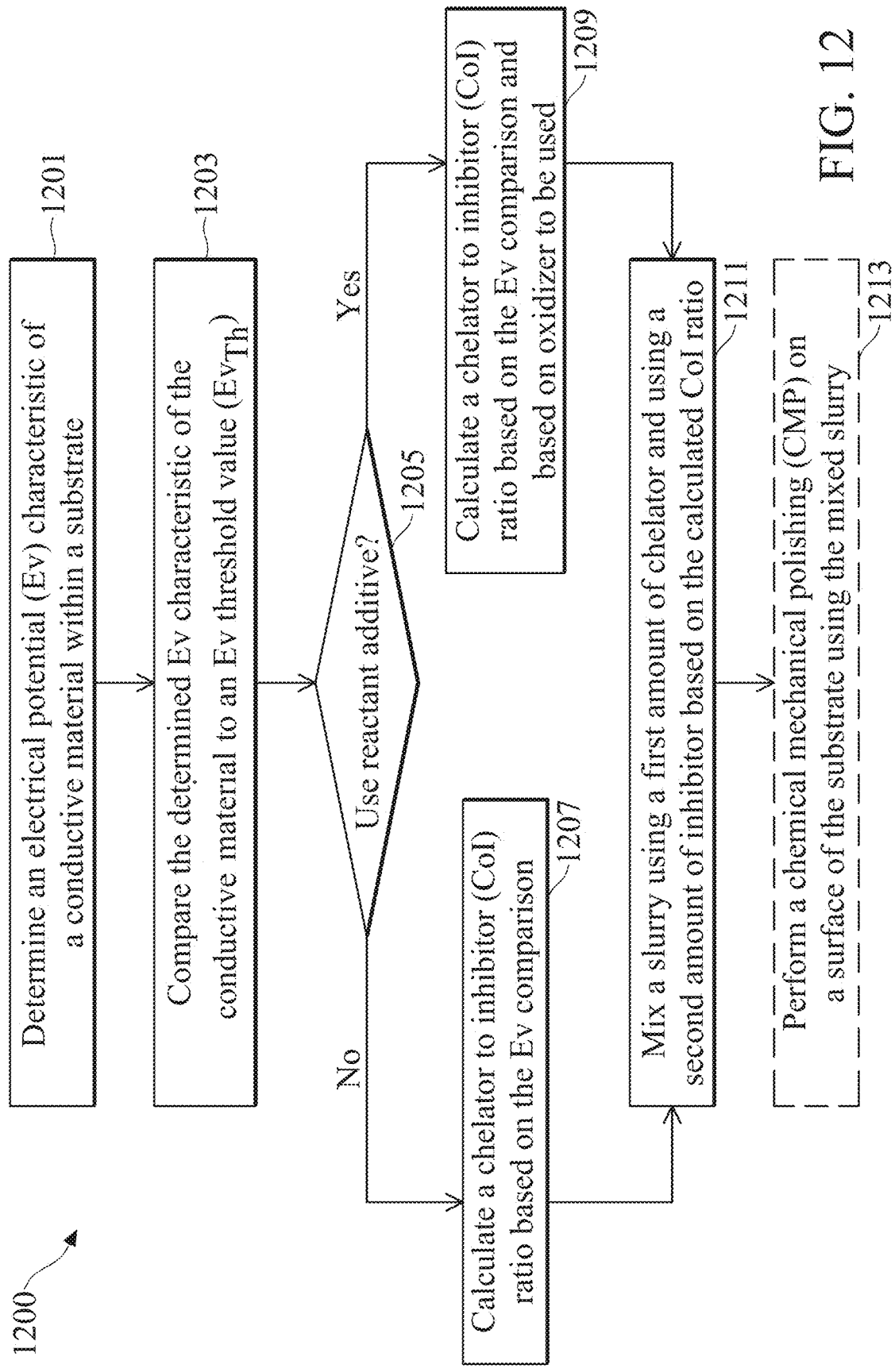
FIG. 12 illustrates a flow diagram of a method of manufacturing a CMP slurry and performing a CMP process on a workpiece, in accordance with some embodiments.

FIG. 12 illustrates a flow diagram of a method 1200 performed for manufacturing a CMP slurry 201 and using the CMP slurry 201 to perform a CMP processing of a surface of a workpiece 100. The method 1200 may be performed by a semiconductor processing system 500 under control of a control unit 580 of the semiconductor processing system 500. In step 1201, an electrical potential (Ev) of a conductive fill material 105 of a workpiece 100 is determined via a test system 520 of the semiconductor processing system 500. The test system 520 may be configured to measure the electrical potential (Ev) of the material (e.g., copper (Cu)) of the conductive fill material 105. Once the electrical potential (Ev) of the conductive fill material 105 is determined in step 1201, the control unit 580 may use the electrical potential (Ev) in step 1203 to compare the determined Ev characteristic of the conductive fill material 105 to an Ev threshold value ($Ev_{TH}$). In some embodiments, $Ev_{TH}$ may be equal to −0.25V. However, other suitable thresholds may be used.

In step 1205, the control unit 580 may determine whether a reactant additive may be used. In some embodiments, the reactant additive may include oxidation agent molecules 401 suitable for reacting with the conductive fill material 105.

If in step 1205, it is determined that a reactive additive should not be used, the process moves to step 1207. In step 1207, the control unit 580 is configured to calculate a first chelator to inhibitor (CoI) ratio based on the comparison of the Ev made in step 1203 according to a first formula:

40%≤first CoI≤100%, when Ev≤−0.25V; and

100%<first CoI≤140%, when Ev>−0.25V.

Once the first chelator to inhibitor (CoI) ratio has been determined, the process moves to step 1211 under control of the control unit 580 to initiate preparation of a CMP slurry 201 by a slurry preparation system 540 according to the first CoI.

If in step 1205, however, it is determined that a reactive additive (e.g., metal oxidizing agent) should be used, the process moves to step 1209. In step 1209, the control unit 580 is configured to calculate a second chelator to inhibitor (CoI) ratio based on the comparison of the Ev made in step 1203 and based on the reactive additive (e.g., metal oxidizing agent) according to a second formula:

0%≤second CoI≤60%, when Ev≤−0.25V; and

60%<second CoI≤100%, when Ev>−0.25V.

Once the second chelator to inhibitor (CoI) ratio has been determined, the process moves to step 1211 under control of the control unit 580 to initiate preparation of a CMP slurry 201 according to the second CoI ratio.

In step 1211, the control unit 580 may control a slurry preparation system 540 to mix the CMP slurry 201 using a first amount of chelator additive and using a second amount of the inhibitor additive based on the calculated CoI ratio determined in either of steps 1207 or 1209. In an embodiment, the determined CoI ratio may provide for an optimal concentration of chelator additive to inhibitor additive to achieve a balance between a rate of corrosion and removal of the conductive fill material 105 and a rate of metal ion re-distribution of the conductive fill material 105 during CMP removal. As such, a subsequent CMP removal process may be performed using the CMP slurry 201 such that metal corrosion (e.g., dishing) and metal ion re-deposition on surfaces of the workpiece 100 are minimized.

In step 1213, a CMP processing system 560 may be controlled by the control unit 580 to receive the CMP slurry 201 from the slurry preparation system 540 and perform one or more CMP processes on a surface of the workpiece 100. According to embodiments described herein, the combined efforts of the chelator additive, the inhibitor additive, and/or the oxidizer additive of the CMP slurry 201 aides in the subsequent CMP removal processes such that metal corrosion (e.g., dishing) and metal ion re-deposition on surfaces of the workpiece 100 are minimized. In some embodiments, the CMP slurry 201 may be may be prepared based on certain characteristics (e.g., the electrical potential (Ev)) of the conductive fill material 105 of the workpiece 100.

In an embodiment, a method includes: applying a chemical mechanical polishing slurry to a surface of a workpiece, wherein the slurry has a ratio of a first volume of a first additive to a second volume of a second additive, the ratio being between 40% and 100%, 40% inclusive and 100% inclusive, when an electrical potential of a conductive material of the workpiece is less than or equal to a threshold voltage, and the ratio being between 100% and 140%, 140% inclusive, when the electrical potential of the conductive material of the workpiece is greater than the threshold voltage; and performing a chemical mechanical polishing procedure to the surface of the workpiece using the slurry. In an embodiment, the slurry further includes a reactant additive, the reactant additive being an oxidizing agent of the conductive material of the workpiece. In an embodiment, the first additive is a chelator agent. In an embodiment, the chelator agent is an amino group selected from the group consisting of primary amino groups, secondary amino groups, and ternary amino groups. In an embodiment, the second slurry additive is an inhibitor agent. In an embodiment, the inhibitor agent is one of a carboxyl type inhibitor and a benzene type inhibitor. In an embodiment, the method further includes preparing the slurry using the first volume of the chelator agent and using the second volume of the inhibitor agent.

In an embodiment, the method includes: dispensing a slurry onto a surface of a substrate, the substrate including a conductor and the slurry comprising a first volume of a chelator additive and a second volume of an inhibitor additive; and using the slurry to perform a chemical mechanical polishing on the surface of the substrate, wherein the first volume and the second volume are defined by a chelator to inhibitor ratio according to the formula: 0%≤the chelator to inhibitor ratio ≤60%, when an electrical potential of a material of the conductor less than or equal to a threshold potential and according to: 60%<the chelator to inhibitor ratio ≤100%, when the electrical potential of the material of the conductor is greater than the threshold potential. In an embodiment, the method further includes: determining a material property of the conductor; and determining a first type of the inhibitor additive based on the material property of the conductor, the inhibitor additive being one of a carboxyl type inhibitor additive and a benzene type inhibitor additive. In an embodiment, the method further includes: determining a second type of the chelator additive based on the material property of the conductor and based on the first type of the inhibitor additive, the second type of the chelator agent being an amino group selected from the group consisting of primary amino groups, secondary amino groups, and ternary amino groups. In an embodiment, the method further includes: calculating the chelator to inhibitor ratio based on an electric potential of a material of the conductor. In an embodiment, the method further includes: mixing the first volume of the chelator additive and the second volume of the inhibitor additive into a base slurry to form the slurry. In an embodiment, the method further including: mixing a third volume of an oxidizing agent into the base slurry. In an embodiment, the oxidizing agent oxidizes the material of the conductor.

In an embodiment, a system includes: a holding tank storing a slurry including a first volume of a chelator additive and a second volume of an inhibitor additive, the first volume and the second volume being defined by a chelator to inhibitor ratio; and a chemical mechanical polishing (CMP) unit configured to perform a chemical mechanical polishing procedure on a surface of a substrate using the slurry, wherein the chelator to inhibitor ratio is based on an electrical potential of a material of a conductor disposed within the substrate. In an embodiment, the slurry further comprises a third volume of an oxidizing agent. In an embodiment, the material of the conductor comprises copper (Cu). In an embodiment, the material of the conductor comprises cobalt (Co). In an embodiment, the chelator to inhibitor ratio is determined according to: 40%≤the chelator to inhibitor ratio ≤100%, when the electrical potential of the material of the conductor is ≤−0.25V; and 100%<the ratio range ≤140%, when the electrical potential of the material of the conductor is >−0.25V. In an embodiment, the chelator to inhibitor ratio is determined according to: 0%≤the chelator to inhibitor ratio ≤60%, when the electrical potential of the material of the conductor is ≤−0.25V; and 60%<the ratio range ≤100%, when the electrical potential of the material of the conductor is >−0.25V.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   measuring an electrical potential of a conductive material of a workpiece, the conductive material comprising an alloy;
   selecting a composition of a slurry to apply to a surface of the workpiece, wherein the composition of the slurry has a ratio of a first volume of a first additive to a second volume of a second additive, the selecting the composition comprising:
   the ratio being based on the electrical potential of the conductive material, the ratio being between 40% and 100%, 40% inclusive and 100% inclusive, when the electrical potential of the conductive material of the workpiece is less than or equal to a threshold voltage; and
   the ratio being between 100% and 140%, 140% inclusive, when the electrical potential of the conductive material of the workpiece is greater than the threshold voltage;
   applying the slurry to the surface of the workpiece; and
   performing a chemical mechanical polishing procedure to the surface of the workpiece using the slurry.

2. The method of claim 1, wherein the slurry further comprises a reactant additive, the reactant additive being an oxidizing agent of the conductive material of the workpiece.

3. The method of claim 1, wherein the first additive is a chelator agent.

4. The method of claim 3, the chelator agent being an amino group selected from the group consisting of primary amino groups, secondary amino groups, and ternary amino groups.

5. The method of claim 3, wherein the second additive is an inhibitor agent.

6. The method of claim 5, wherein the inhibitor agent is one of a carboxyl type inhibitor and a benzene type inhibitor.

7. The method of claim 5, the method further comprising:
   preparing the slurry using the first volume of the chelator agent and using the second volume of the inhibitor agent.

8. A method comprising:
   measuring an electrical potential of a material of a conductor, the conductor comprising an alloy;
   selecting between a first ratio and a second ratio of a slurry, each of the first ratio and the second ratio being defined by a ratio of a first volume of a chelator additive to a second volume of an inhibitor additive, the second ratio being greater than the first ratio, the selecting between the first ratio and the second ratio comprising choosing between the first ratio and the second ratio depending on whether the electrical potential of the material is less than or equal to a threshold potential or greater than the threshold potential, respectively;
   dispensing the slurry onto a surface of a substrate, the substrate including the conductor and the slurry comprising the first volume of the chelator additive and the second volume of the inhibitor additive; and
   using the slurry to perform a chemical mechanical polishing on the surface of the substrate.

9. The method of claim 8 further comprising:
   determining a material property of the conductor; and
   determining a first type of the inhibitor additive based on the material property of the conductor, the inhibitor additive being one of a carboxyl type inhibitor additive and a benzene type inhibitor additive.

10. The method of claim 9 further comprising:
    determining a second type of the chelator additive based on the material property of the conductor and based on the first type of the inhibitor additive, the second type of the chelator additive being an amino group selected from the group consisting of primary amino groups, secondary amino groups, and ternary amino groups.

11. The method of claim 8, further comprising:
    mixing the first volume of the chelator additive and the second volume of the inhibitor additive into a base slurry to form the slurry.

12. The method of claim 11, further comprising:
    mixing a third volume of an oxidizing agent into the base slurry.

13. The method of claim 12, wherein the oxidizing agent oxidizes the material of the conductor.

14. The method of claim 12, wherein:
    0%≤the chelator to inhibitor ratio ≤60%, when the electrical potential of the material of the conductor is less than or equal to the threshold potential; and
    60%<the chelator to inhibitor ratio 100%, when the electrical potential of the material of the conductor is greater than the threshold potential.

15. A method comprising:
    choosing a chelator to inhibitor ratio of a slurry based on an electrical potential of a material of a conductor disposed within a substrate, the conductor comprising an alloy;
    removing the slurry from a holding tank, the slurry comprising a first volume of a chelator additive and a second volume of an inhibitor additive, the first volume and the second volume being defined by the chelator to inhibitor ratio; and
    sending the slurry to a chemical mechanical polishing (CMP) unit configured to perform a chemical mechanical polishing procedure on a surface of the substrate using the slurry.

16. The method of claim 15, wherein the slurry further comprises a third volume of an oxidizing agent.

17. The method of claim 15, wherein the material of the conductor comprises copper (Cu).

18. The method of claim 15, wherein the material of the conductor comprises cobalt (Co).

19. The method of claim 15, wherein the chelator to inhibitor ratio is determined according to: 40%≤the chelator to inhibitor ratio ≤100%, when the electrical potential of the material of the conductor is ≤−0.25V; and 100%<the chelator to inhibitor ratio ≤140%, when the electrical potential of the material of the conductor is >−0.25V.

20. The method of claim 15, wherein the chelator to inhibitor ratio is determined according to: 0%≤the chelator to inhibitor ratio ≤60%, when the electrical potential of the material of the conductor is ≤−0.25V; and 60%<the chelator to inhibitor ratio ≤100%, when the electrical potential of the material of the conductor is >−0.25V.

* * * * *